US012566374B2

(12) United States Patent
Lai et al.

(10) Patent No.: US 12,566,374 B2
(45) Date of Patent: Mar. 3, 2026

(54) PHOTORESIST COMPOSITION AND METHOD OF MANUFACTURING SEMICONDUCTOR DEVICE

(71) Applicant: TAIWAN SEMICONDUCTOR MANUFACTURING CO., LTD., Hsinchu (TW)

(72) Inventors: Wei-Han Lai, New Taipei (TW); Li-Po Yang, Hsinchu (TW); Shang-Wern Chang, Zhubei (TW); Ching-Yu Chang, Yuansun Village (TW); Tzu-Yang Lin, Tainan (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 465 days.

(21) Appl. No.: 17/169,206

(22) Filed: Feb. 5, 2021

(65) Prior Publication Data

US 2021/0311388 A1 Oct. 7, 2021

Related U.S. Application Data

(60) Provisional application No. 63/002,242, filed on Mar. 30, 2020.

(51) Int. Cl.

*G03F 7/004* (2006.01)
*G03F 7/038* (2006.01)

(Continued)

(52) U.S. Cl.

CPC ............ *G03F 7/0045* (2013.01); *G03F 7/038* (2013.01); *G03F 7/039* (2013.01); *G03F 7/004* (2013.01); *G03F 7/2004* (2013.01); *G03F 7/38* (2013.01)

(58) Field of Classification Search

CPC ........ G03F 7/0045; G03F 7/038; G03F 7/039; G03F 7/2004; G03F 7/38

See application file for complete search history.

(56) References Cited

U.S. PATENT DOCUMENTS

| | | | |
|---|---|---|---|
| 6,340,556 B1 | 1/2002 | Wong | |
| 8,796,666 B1 | 8/2014 | Huang et al. | |

(Continued)

FOREIGN PATENT DOCUMENTS

| | | | | |
|---|---|---|---|---|
| JP | 2019-061217 A | | 4/2019 | |
| KR | 2021077852 A | * | 6/2021 | ........... G03F 7/0045 |
| TW | 201327057 A | | 7/2013 | |

OTHER PUBLICATIONS

Feng, Bo et al., "Research Progress on Matrix Resin for Photoresist", Ministry of Education Key Laboratory for Synthesis and Application of Organic Functional Molecules, Faculty of Chemistry and Engineering, Hubei University, Chinese Library Classification No. TQ577.2.5 Document ID Code: A, Artical No. 1001-5922 (2015) 02-0078-04, pp. 78-81, 86.

*Primary Examiner* — Mark F. Huff
*Assistant Examiner* — Richard David Champion
(74) *Attorney, Agent, or Firm* — STUDEBAKER BRACKETT PLLC

(57) ABSTRACT

Manufacturing semiconductor device includes forming photoresist layer. Photoresist layer is selectively exposed to actinic radiation and developed to form pattern. Photoresist composition includes: iodine-containing sensitizer, photoactive compound, polymer. Iodine-containing sensitizer includes ammonium, phosphonium, or heterocyclic ammonium iodides, (Continued)

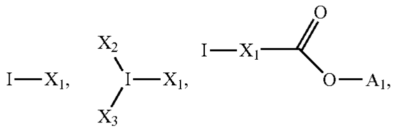

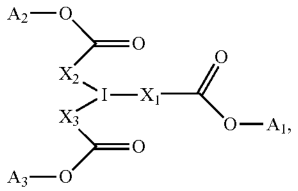

$I^-$ or

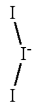

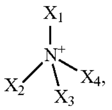

$I^-$ or

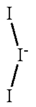

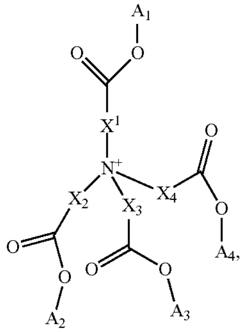

where $X_1$, $X_2$, $X_3$, and $X_4$ are independently direct bond, C6-C30 iodo-aryl group, C1-C30 iodo-alkyl group, C3-C30 iodo-cycloalkyl group, C1-C30 iodo-hydroxylalkyl group, C2-C30 iodo-alkoxy group, C3-C30 iodo-alkoxyl alkyl group, C1-C30 iodo-acetyl group, C2-C30 iodo-acetylalkyl group, C1-C30 iodo-carboxyl group, C2-C30 iodo-alky carboxyl group, and C4-C30 iodo-cycloalkyl carboxyl group; C3-C30 saturated or unsaturated iodo-hydrocarbon ring, or C3-C30 iodo-heterocyclic group; $A_1$, $A_2$, $A_3$, $A_4$ are independently acid labile group selected from C6-C15 iodo-aryl group, C4-C15 iodo-alkyl group, C4-C15 iodo-cycloalkyl group, C4-C15 iodo-hydroxylalkyl group, C4-C15 iodo-alkoxy group, and C4-C15 iodo-alkoxyl alkyl group.

20 Claims, 30 Drawing Sheets

(51) Int. Cl.

| | |
|---|---|
| ***G03F 7/039*** | (2006.01) |
| *G03F 7/20* | (2006.01) |
| *G03F 7/38* | (2006.01) |

(56) References Cited

U.S. PATENT DOCUMENTS

| | | | | |
|---|---|---|---|---|
| 9,093,530 | B2 | 7/2015 | Huang et al. | |
| 9,213,234 | B2 | 12/2015 | Chang | |
| 9,223,220 | B2 | 12/2015 | Chang | |
| 9,256,133 | B2 | 2/2016 | Chang | |
| 9,536,759 | B2 | 1/2017 | Yang et al. | |
| 9,548,303 | B2 | 1/2017 | Lee et al. | |
| 9,857,684 | B2 | 1/2018 | Lin et al. | |
| 9,859,206 | B2 | 1/2018 | Yu et al. | |
| 9,875,892 | B2 | 1/2018 | Chang et al. | |
| 2003/0027077 | A1 | 2/2003 | Zampini et al. | |
| 2003/0134232 | A1* | 7/2003 | Yokoyama | G03F 7/0046 430/318 |
| 2011/0059404 | A1* | 3/2011 | Sakamoto | G03F 7/091 430/319 |
| 2013/0164691 | A1 | 6/2013 | Shiobara | |
| 2018/0143532 | A1* | 5/2018 | Hatakeyama | G03F 7/425 |
| 2020/0026188 | A1 | 1/2020 | Maruyama | |
| 2021/0173309 | A1* | 6/2021 | Sakita | G03F 7/0392 |
| 2021/0181628 | A1* | 6/2021 | Nguyen | G03F 7/0045 |

* cited by examiner ammonium iodide $I^-$ or $I_3^-$ phosphonium iodide $I^-$ or $I_3^-$ heterocyclic ammonium Iodide $I^-$ or $I_3^-$ ammonium triiodide benzyl(tri-methyl) ammonium triiodide $NH_4I$ ammonium iodide tetra-methyl ammonium triiodide tetra-methyl ammonium iodide tetra-butyl ammonium iodide tetra-butyl ammonium triiodide (v-phenenyltris(oxyethylene))tris(trimethyl) ammonium triiodide triethyl(2-(2-pyridyl)ethyl)ammonium iodide (trimethyl)phenyl-ammonium Iodide (2-hydroxy-1,1-dimethyl-ethyl)-methyl-ammonium iodide

[3-(1-adamantyl)-3-oxopropyl](trimethyl)ammonium iodide iodobenzene tri-iodobenzene

[bis(trifluoroacetoxy)iodo]benzene

[hydroxy(tosyloxy)iodo]benzene

[(N-tosylimino)iodo]benzene

[hydroxy-(2,4-dinitrobenzenesulfonyloxy)iodo] benzene iopamidol 1-ethoxy-4-iodo-benzene 1,2,4,5-tetrakis(4-tert-butylphenyl)-3,6-diiodo-benzene

[bis(trifluoroacetoxy)iodo]benzene 1,4-diiodo-2,5-bis(octyloxy)benzene triiodothyronine 1-N,3-N-bis(2,3-dihydroxypropyl)-5-[(2-hydroxyacetyl)-(2-hydroxyethyl)amino]-2,4,6-triiodobenzene-1,3 dicarboxamide 1,4-diiodo-2,5-di(3-pentanyl)benzene 2,4,6-triiodobenzene-1,3,5-tricarboxylic acid 2-(1,1-diphenylpropoxy)-1,3,5-triiodobenzene

PHOTORESIST COMPOSITION AND METHOD OF MANUFACTURING SEMICONDUCTOR DEVICE

CROSS-REFERENCE TO RELATED APPLICATION

This application claims priority to U.S. Provisional Patent Application No. 63/002,242, filed Mar. 30, 2020, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable. Wafer exposure throughput can be improved through increased exposure power or increased resist photospeed. Low exposure dose may lead to increased line width roughness and reduced critical dimension uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11A, 111B, and 11C show photoresist polymers according to embodiments of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
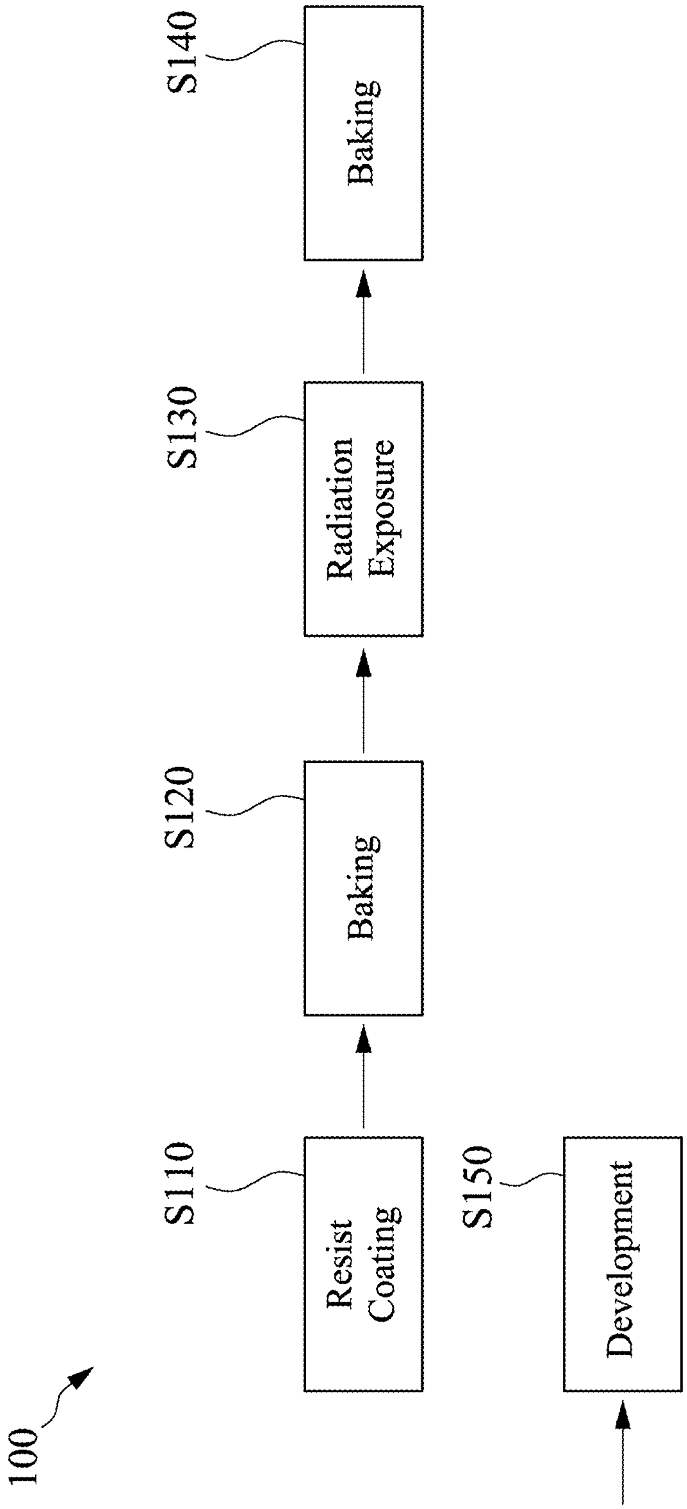
FIG. 1 illustrates a process flow of manufacturing a semiconductor device according to embodiments of the disclosure.
Figure 2:
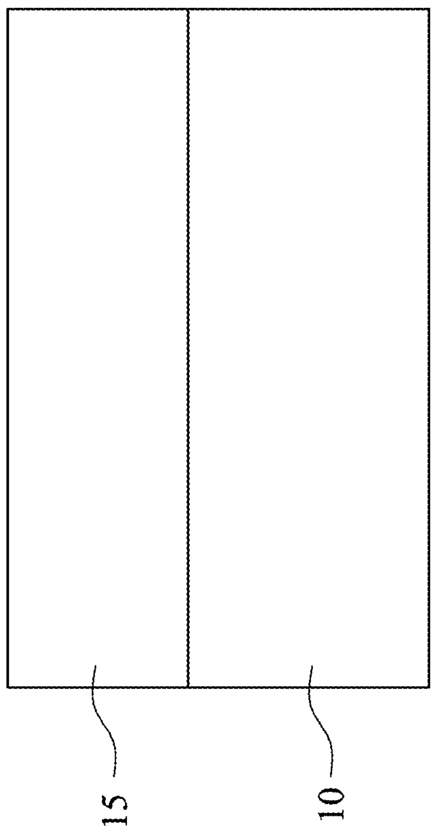
FIG. 2 shows a process stage of a sequential operation according to an embodiment of the disclosure.

FIG. 1 illustrates a process flow 100 of manufacturing a semiconductor device according to embodiments of the disclosure. A photoresist is coated on a surface of a layer to be patterned or a substrate 10 in operation S110, in some embodiments, to form a photoresist layer 15, as shown in FIG. 2. Then the photoresist layer 15 undergoes a first baking operation S120 to evaporate solvents in the photoresist composition in some embodiments. The photoresist layer 15 is baked at a temperature and time sufficient to cure and dry the photoresist layer 15. In some embodiments, the photoresist layer is heated to a temperature of about 40° C. to 120° C. for about 10 seconds to about 10 minutes.

After the first baking operation S120, the photoresist layer 15 is selectively exposed to actinic radiation 45/97 (see FIGS. 3A and 3B) in operation S130. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the radiation is an electron beam.

Figure 3A:
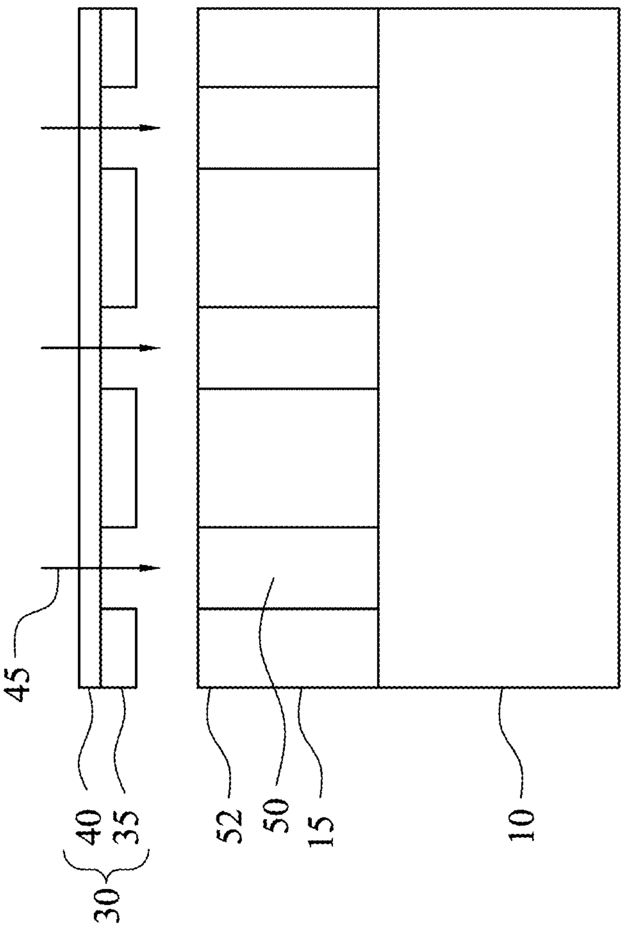
FIGS. 3A and 3B show a process stage of a sequential operation according to an embodiment of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
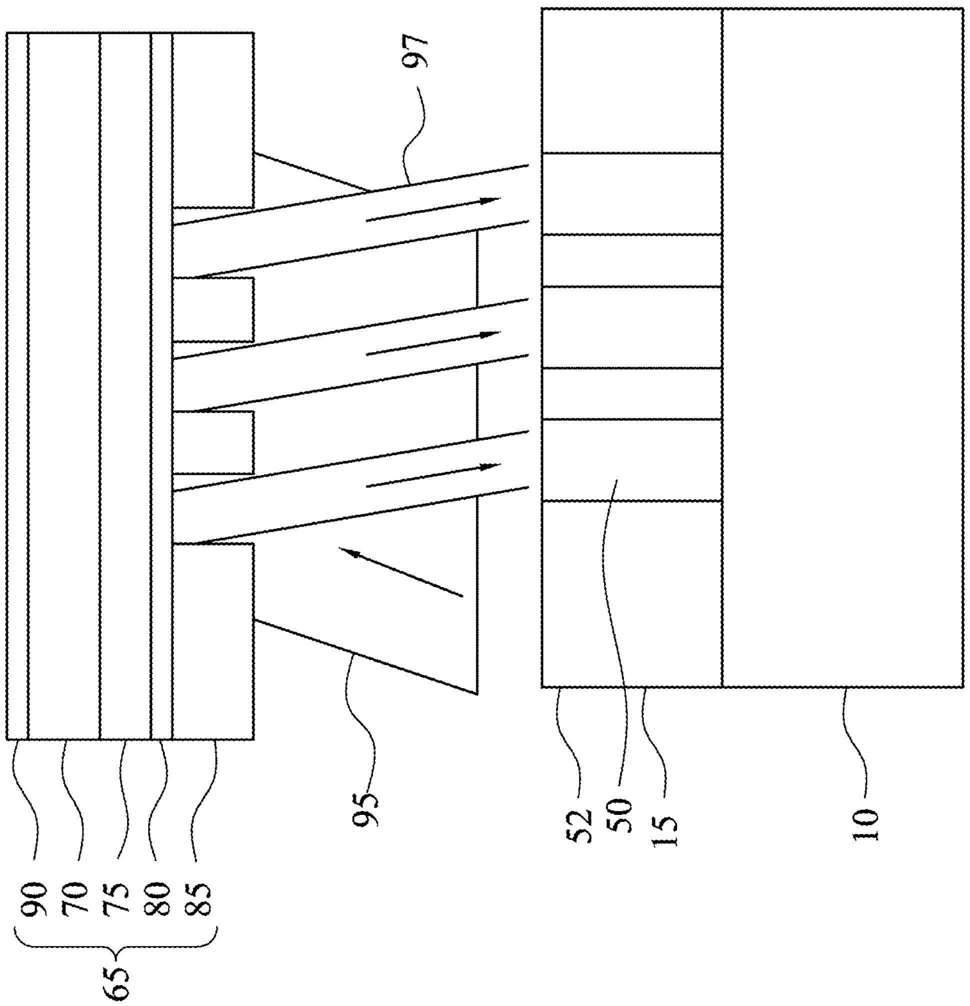

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a reaction making the exposed portion more soluble in a developer. In other embodiments, the portion of the photoresist layer exposed to radiation 50 undergoes a crosslinking reaction making the exposed portion less soluble in a developer.

Next, the photoresist layer 15 undergoes a post-exposure bake in operation S140. In some embodiments, the photoresist layer 15 is heated to a temperature of about 50° C. to 160° C. for about 20 seconds to about 10 minutes. In some embodiments, the photoresist layer 15 is heated for about 30 seconds to about 5 minutes. In some embodiments, the photoresist layer 15 is heated for about 1 minute to about 2 minutes. The post-exposure baking may be used to assist in the generating, dispersing, and reacting of the acid/base/free radical generated from the impingement of the radiation 45/97 upon the photoresist layer 15 during the exposure. Such assistance helps to create or enhance chemical reactions that generate chemical differences between the exposed region 50 and the unexposed region 52 within the photoresist layer. These chemical differences also cause differences in the solubility between the exposed region 50 and the unexposed region 52.

Figure 4:
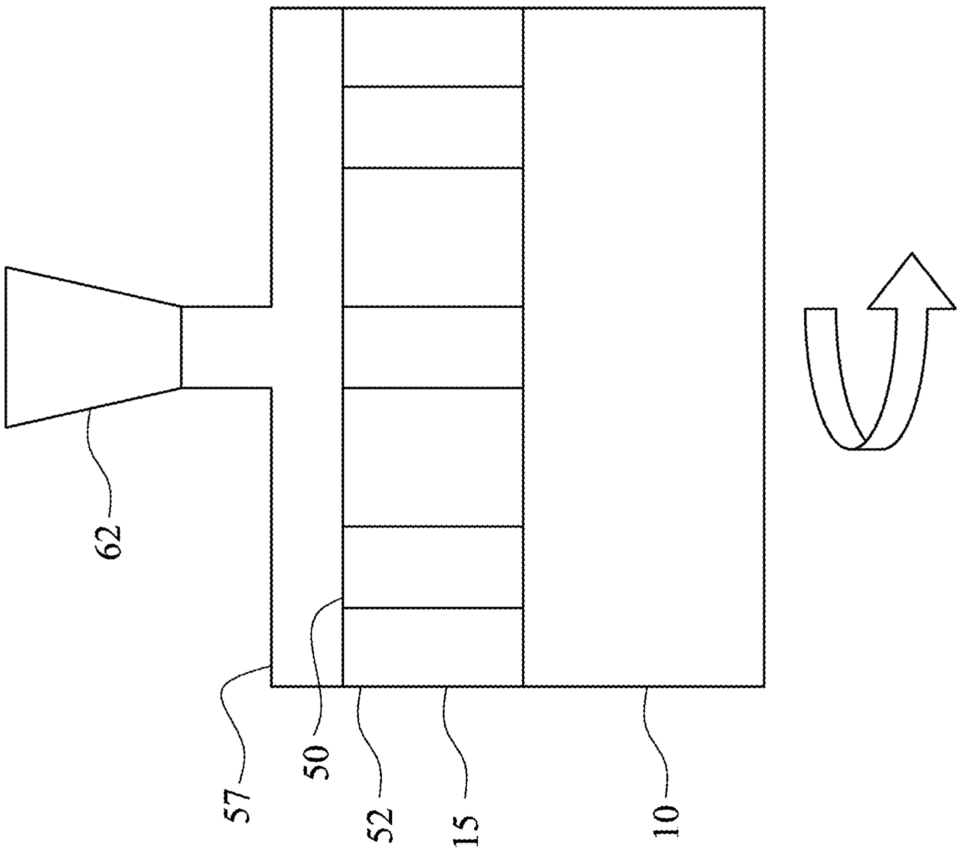
FIG. 4 shows a process stage of a sequential operation according to an embodiment of the disclosure.
Figure 5B:
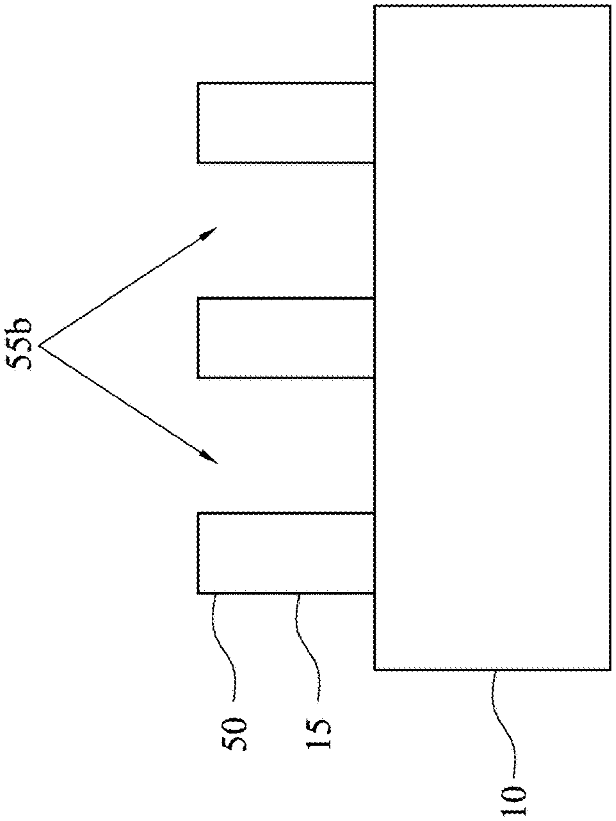
FIGS. 5A and 5B show a process stage of a sequential operation according to an embodiment of the disclosure.
Figure 5A:
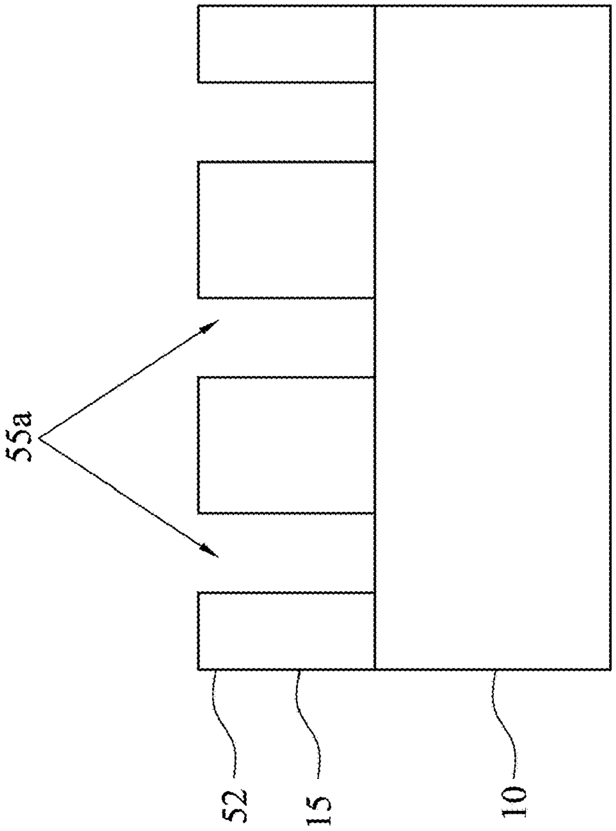

The selectively exposed photoresist layer is subsequently developed by applying a developer to the selectively exposed photoresist layer in operation S150. As shown in FIG. 4, a developer 57 is supplied from a dispenser 62 to the photoresist layer 15. In some embodiments, the exposed portion of the photoresist layer 50 is removed by the developer 57 forming a pattern of openings 55*a* in the photoresist layer 15 to expose the substrate 10, as shown in FIG. 5A. In other embodiments, the unexposed portion of the photoresist layer 52 is removed by the developer 57 forming a pattern of openings 55*b* in the photoresist layer 15 to expose the substrate 10, as shown in FIG. 5B.

Figure 6B:
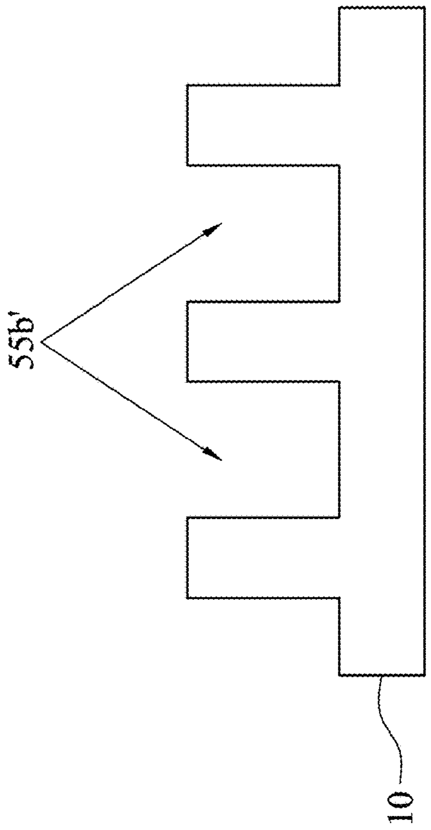
FIGS. 6A and 6B show a process stage of a sequential operation according to an embodiment of the disclosure.
Figure 6A:
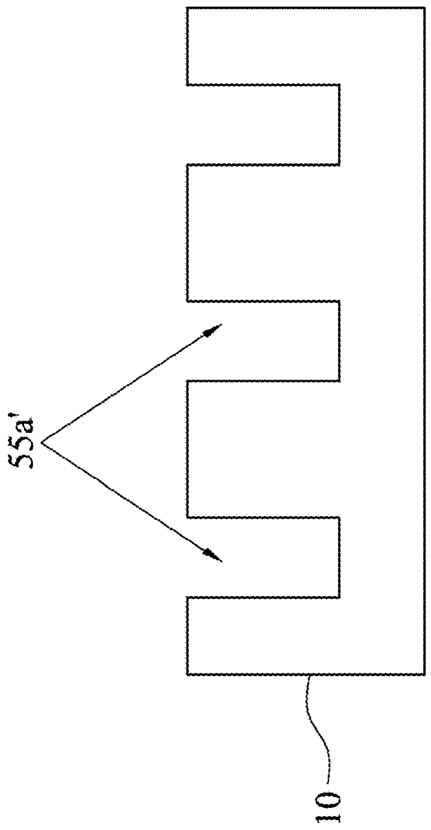

In some embodiments, the pattern of openings 55*a*, 55*b* in the photoresist layer 15 are extended into the layer to be patterned or substrate 10 to create a pattern of openings 55*a*', 55*b*' in the substrate 10, thereby transferring the pattern in the photoresist layer 15 into the substrate 10, as shown in FIGS. 6A and 6B. The pattern is extended into the substrate by etching, using one or more suitable etchants. The remaining photoresist of the photoresist pattern 50, 52 is at least partially removed during the etching operation in some embodiments. In other embodiments, the remaining photoresist of the photoresist pattern 50, 52 is removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent, such as n-butyl acetate (nBA). Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, the photoresist layer 15 includes a high sensitivity photoresist composition. In some embodiments, the high sensitivity photoresist composition is highly sensitive to extreme ultraviolet (EUV) radiation. In some embodiments, the photoresist composition includes a polymer, a photoactive compound (PAC), and a sensitizer.

Figure 7:
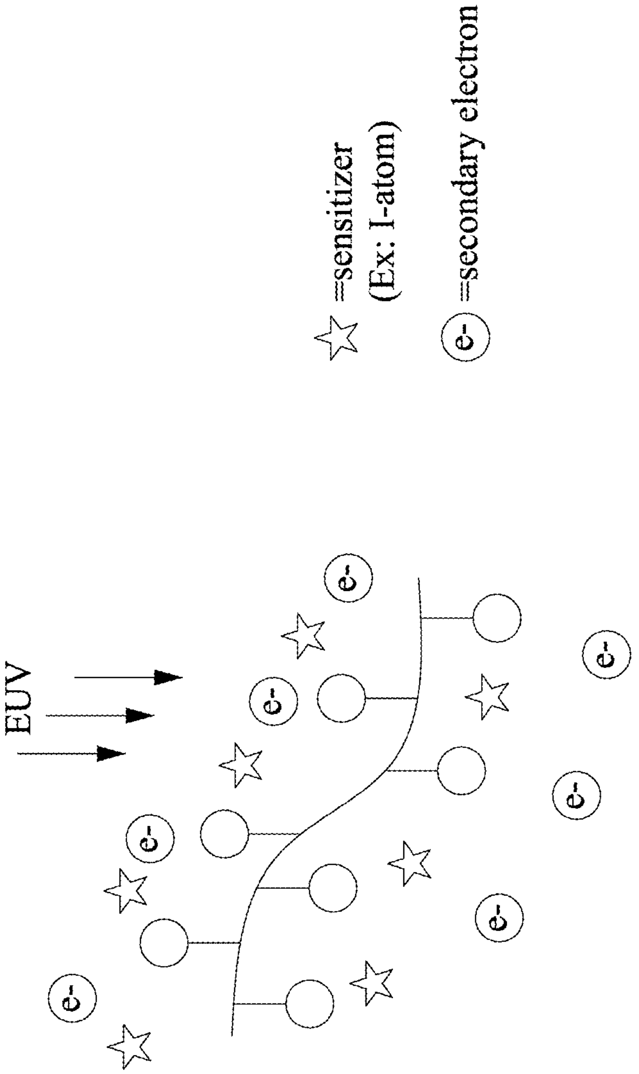
FIG. 7 shows the generation of secondary electrons by sensitizers according to some embodiments of the disclosure.

In some embodiments, sensitizers are used to improve the efficiency of the actinic radiation exposure. Some sensitizers absorb the exposure radiation and generate a secondary electron, as shown in FIG. 7. The secondary electron is absorbed by a photoacid generator and causes the photoacid generator to generate an acid, thereby causing the chemical amplified reaction to proceed. Some sensitizers absorb radiation at one wavelength and release radiation at another wavelength. In some embodiments, the released radiation is at or near the optimum wavelength to be absorbed by a photoacid generator. However, the wavelength of extreme ultraviolet radiation (<100 nm) is too small to be absorbed by many sensitizers. Iodine has a high atomic absorption cross section and is desirable as a component of sensitizer molecule because it has high EUV absorption capacity. However, iodine-containing sensitizers and photoacid generators have low solubility in many photoresist developers, resulting in photoresist scum and residue remaining in photoresist patterns after the developing operation.

In some embodiments of the disclosure, an iodine-containing sensitizer is provided that has good solubility in both organic solvent developers and aqueous developers, such as tetramethylammonuim hydroxide (TMAH)-based developers. In some embodiments, the iodine-containing sensitizer absorbs radiation at a first shorter wavelength, such as extreme ultraviolet radiation below about 100 nm and releases a secondary electron or releases radiation at a second longer wavelength greater than about 100 nm. The secondary electron or longer wavelength radiation is absorbed by a photoacid generator, and then the photoacid generator generates an acid that reacts with an acid labile group on a photoresist polymer, thereby changing the polymer's solubility in a photoresist developer.

Figure 8A:
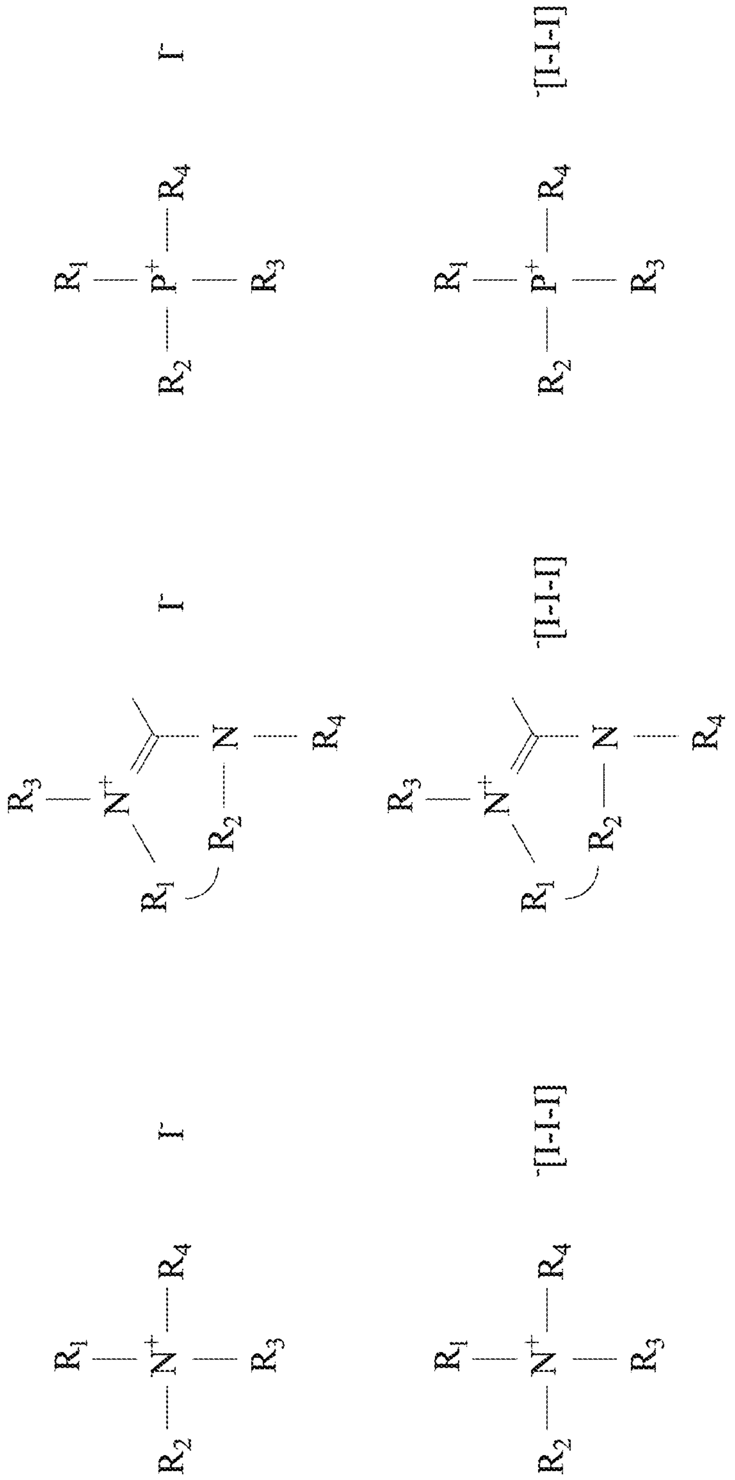
FIG. 8A shows photoresist sensitizers according to embodiments of the disclosure.
Figure 8B:
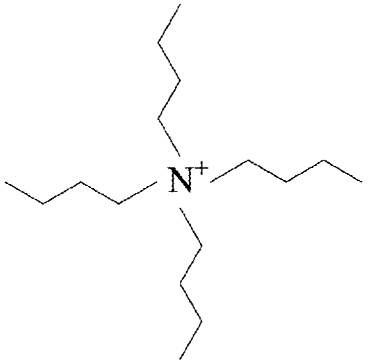
FIG. 8B shows examples of photoresist sensitizers according to embodiments of the disclosure.
Figure 8B:
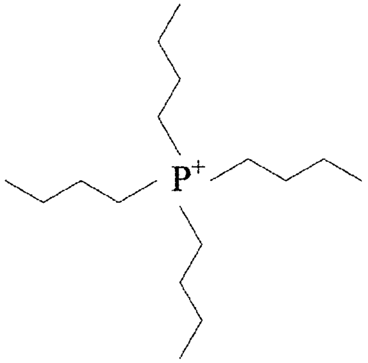
Figure 8B:
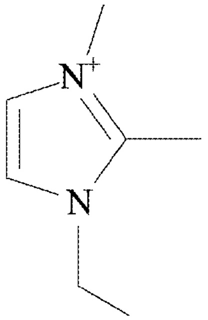
Figure 9A:
FIGS. 9A, 9B, 9C, 9D, 9E, and 9F show photoresist sensitizers according to embodiments of the disclosure.
Figure 9B:
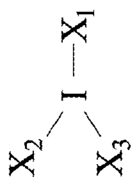
Figure 9C:
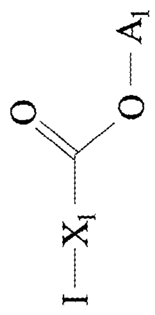
Figure 9D:
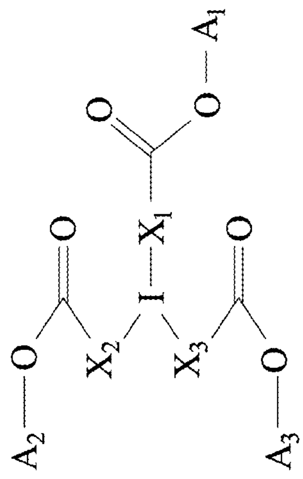
Figure 9E:
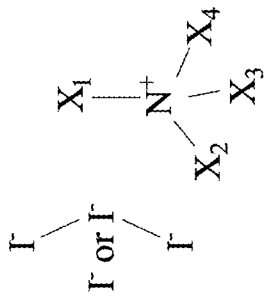
Figure 9F:
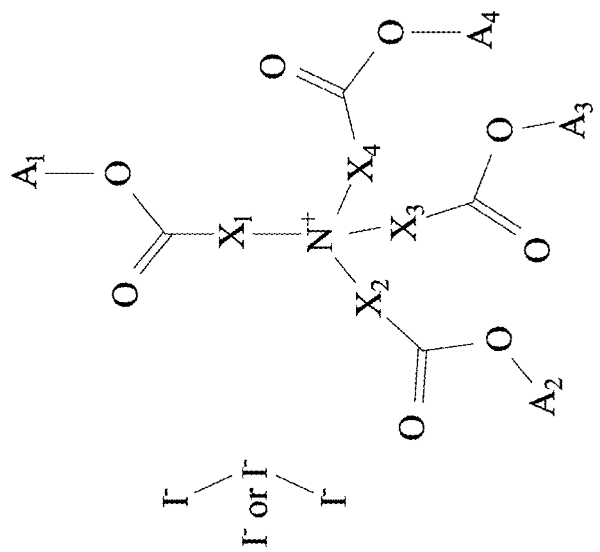
Figure 9G:
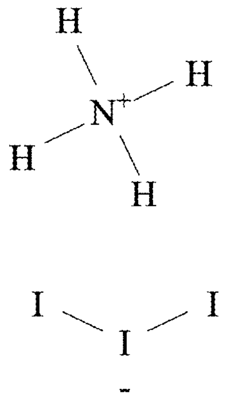
FIGS. 9G, 9H, 9I, 9J, 9K, and 9L show examples of photoresist sensitizers according to embodiments of the disclosure.
Figure 9G:
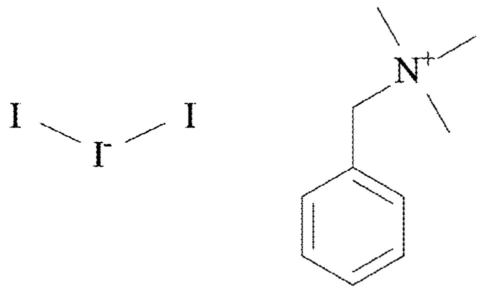
Figure 9G:
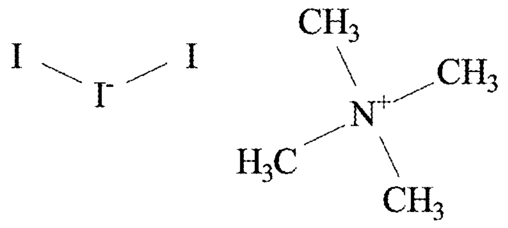
Figure 9G:
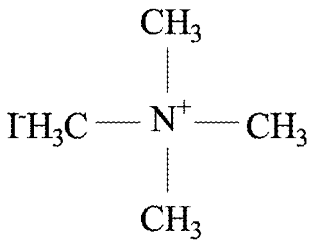
Figure 9H:
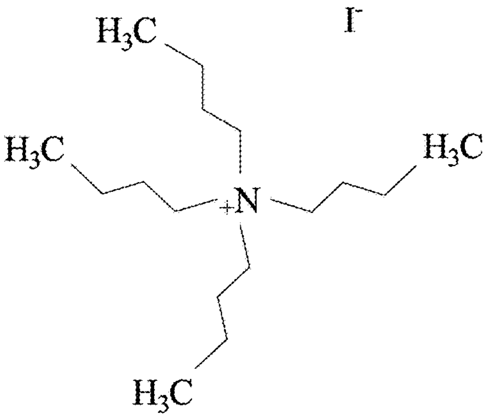
Figure 9H:
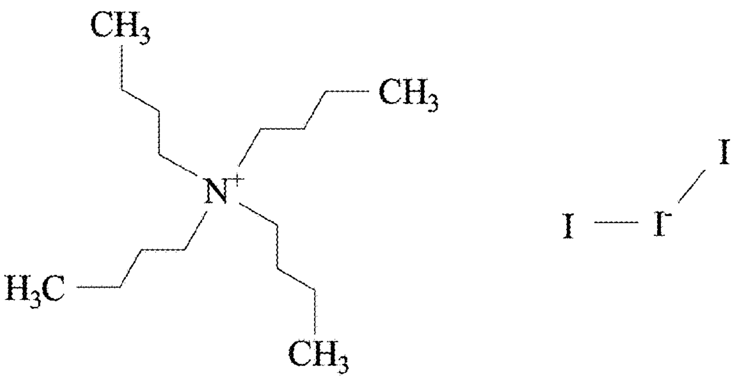
Figure 9H:
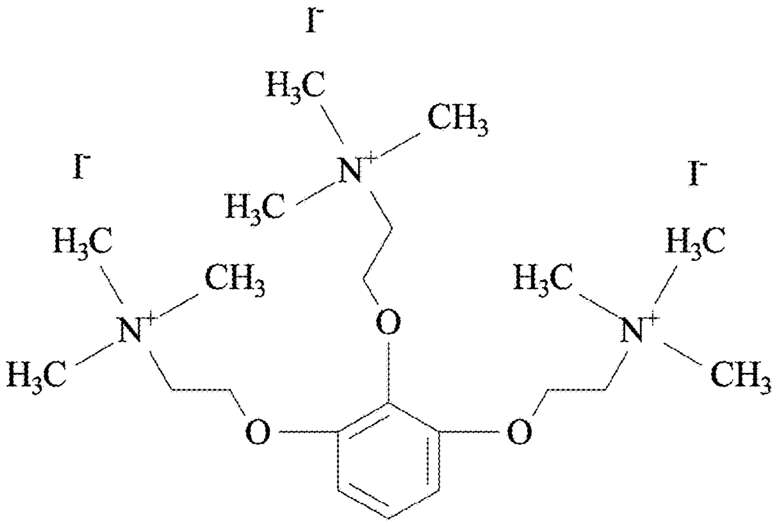
Figure 9I:
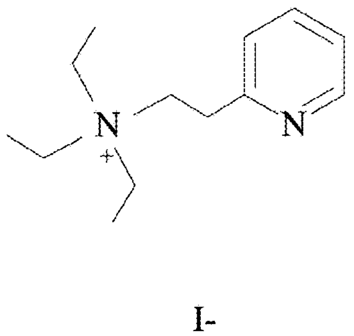
Figure 9I:
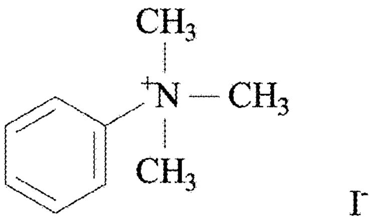
Figure 9I:
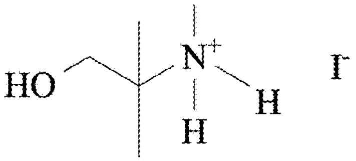
Figure 9I:
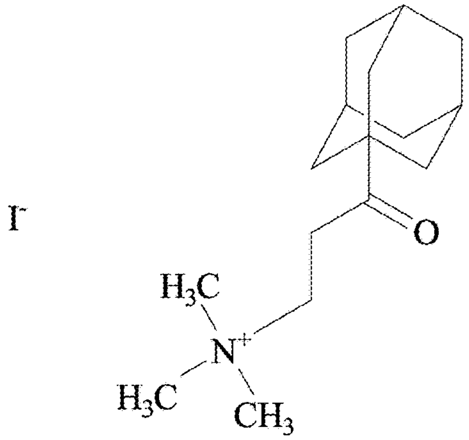
Figure 9J:
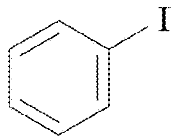
Figure 9J:
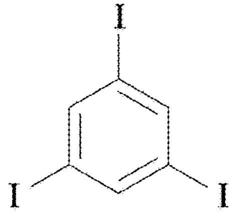
Figure 9J:
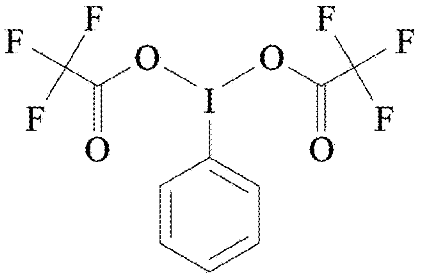
Figure 9J:
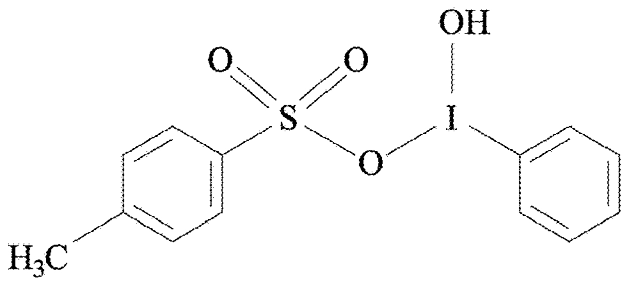
Figure 9J:
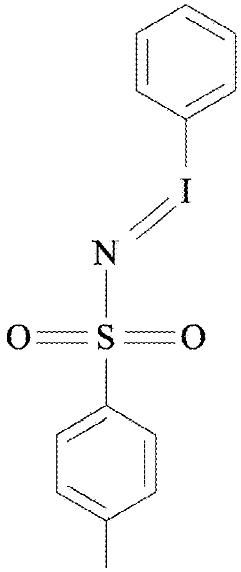
Figure 9J:
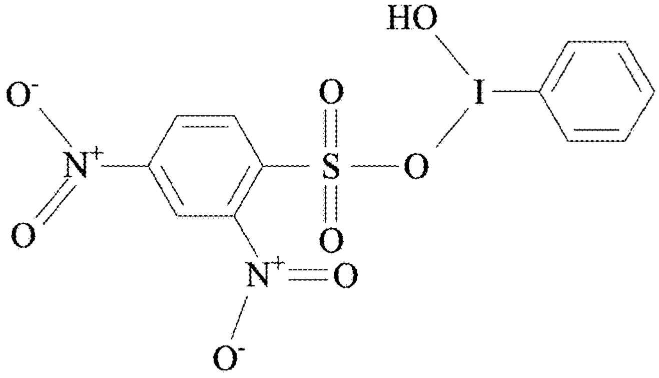
Figure 9K:
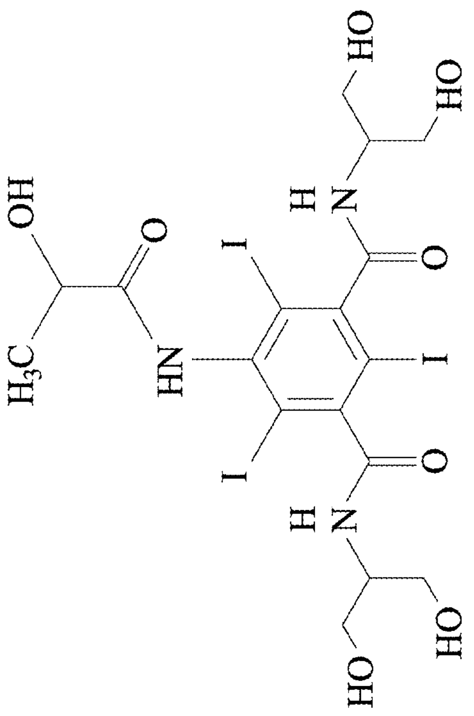
Figure 9K:
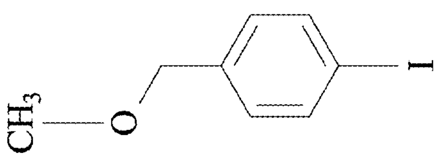
Figure 9K:
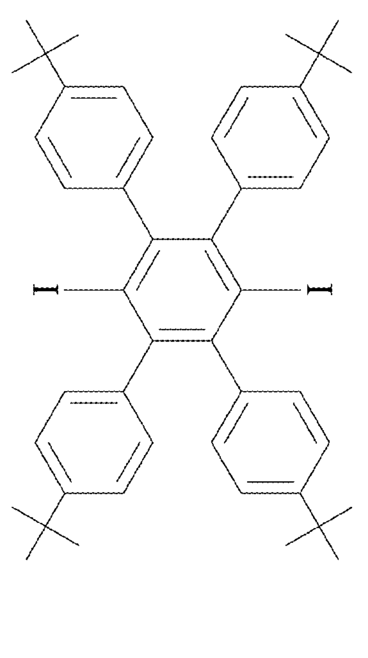
Figure 9K:
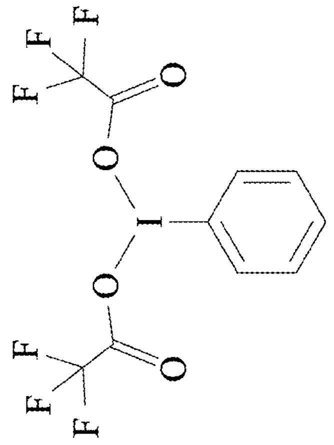
Figure 9L:
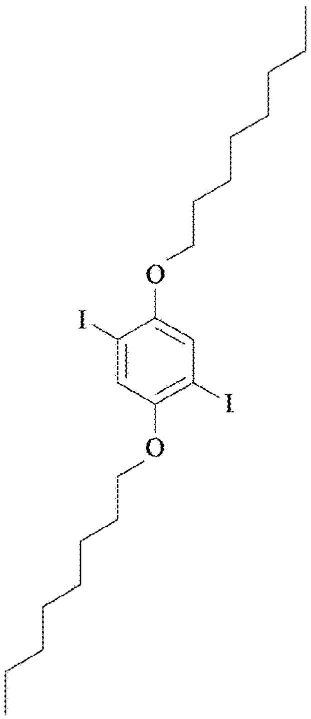
Figure 9L:
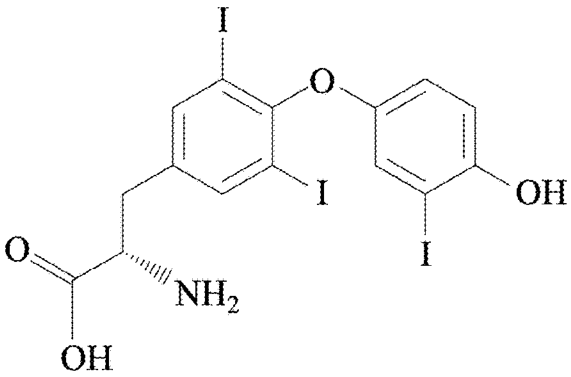
Figure 9L:
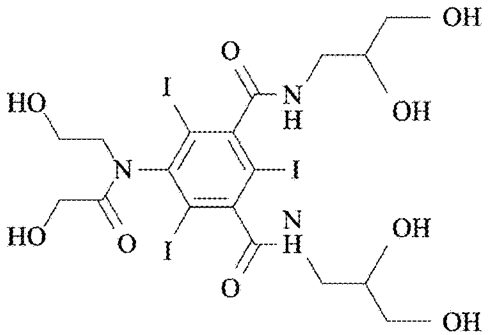
Figure 9L:
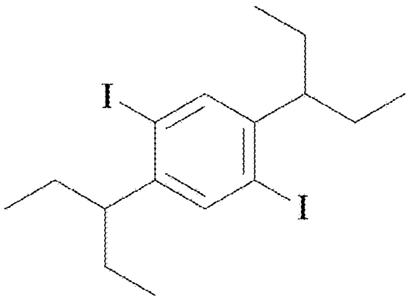
Figure 9L:
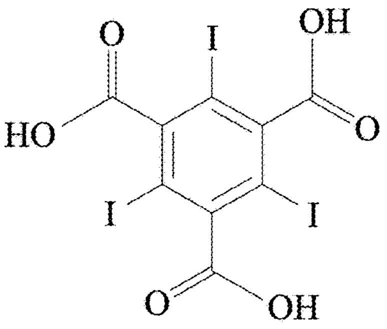
Figure 9L:
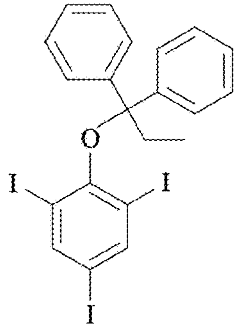

Sensitizers according to embodiments of disclosure include those shown in FIGS. 8A and 8B, where $R_1$, $R_2$, $R_3$, and $R_4$ are independently a C2-C15 alkyl group, a C3-C15 cycloalkyl group, a C1-C15 hydroxylalkyl group, a C2-C15 alkoxy group, a C3-C15 alkoxyl alkyl group, a C1-C15 acetyl group, a C2-C15 acetylalkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 heterocyclic group, or $R_1$ and $R_2$ can form a ring. In some embodiments, $R_1$, $R_2$, $R_3$, and $R_4$ are independently a chain, a ring, or a 3-D structure. In some embodiments, the 3-D structure includes norbornyl, adamantyl, basketanyl, twistanyl, cubanyl, and dodecahedranyl groups. The $R_1$, $R_2$, $R_3$, and $R_4$ groups may be unsubstituted or substituted. In some embodiments, the $R_1$, $R_2$, $R_3$, and $R_4$ groups are substituted with a halogen, including F, Cl, or Br.

As shown in FIGS. 8A and 8B, sensitizers according to some embodiments of the disclosure are ammonium or phosphonium iodides or triiodides.

In some embodiments, sensitizers according to the disclosure include those shown in FIGS. 9A, 9B, 9C, 9D, 9E, 9F, and 9G, where $X_1$, $X_2$, $X_3$, and $X_4$ are independently an H, a C6-C30 iodo-aryl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring or a C3-C30 iodo-heterocyclic group. $A_1$, $A_2$, $A_3$, and $A_4$ are independently an acid labile group selected from one or more of a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group. $X_1$, $X_2$, $X_3$, and $X_4$ can be independently linked to any of $A_1$, $A_2$, $A_3$, and $A_4$ by (COO). In some embodiments, $X_1$, $X_2$, $X_3$, $X_4$, $A_1$, $A_2$, $A_3$, and $A_4$ are independently a chain group, a cyclic group, or a 3-D group. In some embodiments, the 3-D group structure includes norbornyl, adamantyl, basketanyl, twistanyl, cubanyl, and dodecahedranyl groups. In some embodiments, the iodo-aryl groups include phenyl, benzyl, phenanthryl, or anthracenyl groups. The $X_1$, $X_2$, $X_3$, $X_4$, $A_1$, $A_2$, $A_3$, and $A_4$ groups may be unsubstituted or substituted. In some embodiments, the $X_1$, $X_2$, $X_3$, $X_4$, $A_1$, $A_2$, $A_3$, and $A_4$ groups are substituted with a halogen, including F, Cl, or Br.

In some embodiments, sensitizers according to the disclosure include those shown in FIGS. 9H, 9I, 9J, 9K, and 9L. In some embodiments, the iodine-containing sensitizer is one or more of ammonium iodide, ammonium triiodide, tetra-methyl ammonium triiodide, benzyl(tri-methyl) ammonium iodide, tetra-methyl ammonium iodide, tetra-butyl ammonium iodide, tetra-butyl ammonium triiodide, (v-phenenyltris(oxyethylene))tris(trimethyl) ammonium triiodide, triethyl(2-(2-pyridyl)ethyl)ammonium iodide, (trimethyl)phenyl-ammonium iodide, (2-hydroxy-1,1-dimethyl-ethyl)-methyl-ammonium iodide, [3-(1-adamantyl)-3-oxopropyl](trimethyl)ammonium iodide, iodobenzene, triiodobenzene, [bis(trifluoroacetoxy)iodo]benzene, [(N-tosylimino)iodo]benzene, [hydroxy-(2,4-dinitrobenzenesulfonyloxy)iodo]benzene, hydroxy (tosyloxy)iodo]benzene, iopamidol, 1-ethoxy-4-iodobenzene, 1,2,4,5-tetrakis(4-tert-butylphenyl)-3,6-diiodobenzene, bis(trifluoroacetoxy)iodobenzene, 1,4-diiodo-2,5-bis(octyloxy)benzene, triiodothyronine, 1-N,3-N-bis(2,3-dihydroxypropyl)-5-[(2-hydroxyacetyl)-(2-hydroxyethyl) amino]-2,4,6-triiodobenzene-1,3 dicarboxamide, 1,4-diiodo-2,5-di(3-pentanyl)benzene, 2,4,6-triiodobenzen-1,3,5-tricarboxylic acid, and 2-(1,1-diphenylpropoxy)-1,3,5-triiodobenzene.

In some embodiments, the concentration of the iodine-containing sensitizer in the photoresist composition ranges from about 1 wt. % to about 20 wt. % based on the weight of the polymer and the iodine-containing sensitizer. In other embodiments, the concentration of the iodine-containing sensitizer ranges from about 5 wt. % to about 15 wt. %. At sensitizer concentrations below the disclosed ranges, there may be an insufficient generation of secondary electrons and increased line width roughness of the patterned photoresist layer. At sensitizer concentrations above the disclosed ranges, there may an insufficient amount of polymer in the photoresist and increased line width roughness of the patterned photoresist layer, or there may be no significant improvement in photoresist performance.

In some embodiments, such as when EUV radiation is used, the photoresist compositions according to the present disclosure are metal-containing resists. The metal-containing resists include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ce, Ba, La, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a thermally stable ligand, wherein the thermally stable ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of $—CF_3$, —SH, —OH, =O, —S—, —P—, $—PO_2$, —C(=O)SH, —C(=O)OH, —C(=O)O—, —O—, —N—, —C(=O)NH, $—SO_2OH$, $—SO_2SH$, —SOH, and $—SO_2—$. In some embodiments, the ligand includes one or more substituents selected from the group consisting of $—CF_3$, —OH, —SH, and —C(=O)OH substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. % ligand, the organometallic photoresist does not function well. Above about 40 wt. % ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, oxime sulfonate, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

Figure 10:
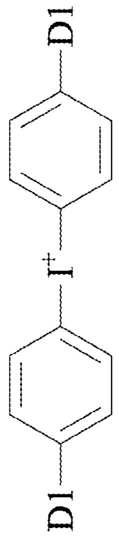
FIG. 10 shows a photoacid generator according to embodiments of the disclosure.

In some embodiments, the photoacid generator is an iodonium having bulky or sterically hindering groups. The iodonium has a high absorption of EUV radiation. The bulky groups control the diffusion length of the iodonium and prevent the photoacid generator from penetrating into the unexposed portions of the photoresist during development. In some embodiments, the iodonium has the structure shown in FIG. 10, where D1 is selected from the group consisting of sterically hindering substituted and unsubstituted cycloalkanes, lactones, and 3-D structures. In some embodiments, the 3-D structures are one or more of norbornyl, adamantyl, basketanyl, twistanyl, cubanyl, or dodecahedranyl groups.

In some embodiments in which the PACs include free-radical generators, including n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer; combinations of these, or the like.

In some embodiments, the PAC includes a quencher. In some embodiments, the quenchers include photobase generators and photo decomposable bases. In embodiments in which the PACs are photobase generators (PBG), the PBGs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

In some embodiments in which the PACs include photo decomposable bases (PBD), the PBDs include triphenylsulfonium hydroxide, triphenylsulfonium antimony hexafluoride, and triphenylsulfonium trifyl.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, the photoresist composition includes a polymer along with one or more photoactive compounds (PACs). In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the polymer is a polyhydroxystyrene, a polymethyl methacrylate, or a polyhydroxystyrene-t-butyl acrylate, e.g.—

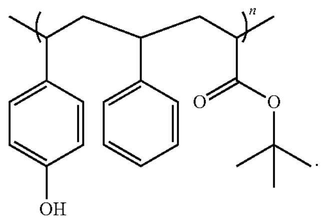

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group that will decompose is an acid labile group that is attached to the hydrocarbon structure that reacts with the acids/bases/free radicals generated by the PACs during exposure. In some embodiments, the group that will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis (alkylcarbonyl)imido group, a bis(alkylsulfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help to improve a variety of properties of the polymerizable resin. For example, inclusion of a lactone group to the hydrocarbon structure assists in reducing the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes a sensitizer attached to the polymer. In some embodiments, the sensitizer is attached directly to the main chain of the polymer, in other embodiments, the sensitizer is attached to a pendant group attached to the polymer main chain. In some embodiments, the sensitizer is iodine or an iodo group attached to the polymer. In some embodiments, in addition to the iodine or iodo group attached to the polymer, the photoresist composition includes an iodine-containing sensitizer as a separate photoresist composition component.

Figure 11A:
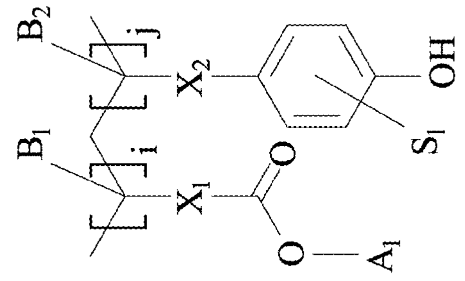
Figure 11B:
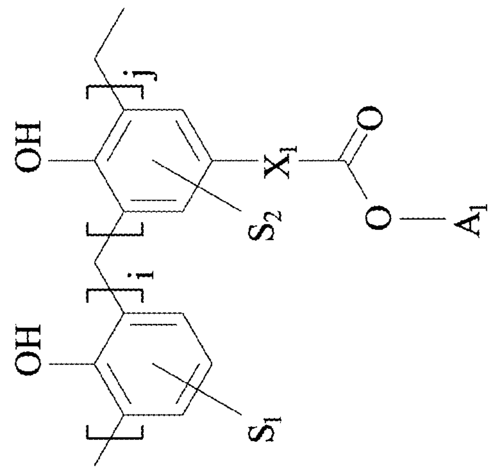
Figure 11C:
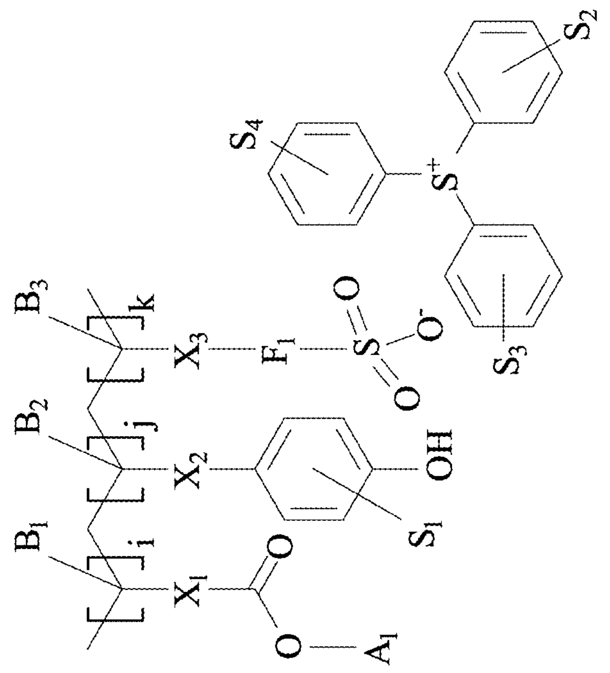

In some embodiments, the polymer includes one or more of the polymers shown in FIGS. 11A, 11B, and 11C, where $X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodohydrocarbon ring or a C3-C30 iodo-heterocyclic group. $A_1$ is an acid labile group selected from the group consisting of a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group. $B_1$, $B_2$, and $B_3$ are independently H, I, a C1-C3 alkyl group, or a C1-C3 iodo-alkyl group. $S_1$, $S_2$, $S_3$, and $S_4$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group. $F_1$ is a C1-C5 fluorocarbon or a C1-C5 iodo-fluorocarbon. The mole percent of the components of polymer chain are 0 mol %≤i≤100 mol %, 0 mol %≤j≤100 mol %, and 0 mol %≤k≤100 mol %. In some embodiments, the iodo-aryl groups include phenyl, benzyl, phenanthryl, or anthracenyl groups. The $X_1$, $X_2$, $X_3$, and $A_1$ groups may be unsubstituted or substituted. In some embodiments, the $X_1$, $X_2$, $X_3$, and $A_1$ groups are substituted with a halogen, including F, Cl, or Br.

Figure 11D:
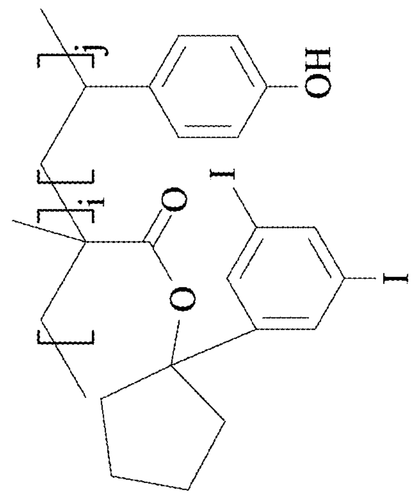
FIGS. 11D, 11E, 11F, 11G, 11H, 11I, 11J, 11K, and 11L show examples of photoresist polymers according to embodiments of the disclosure.
Figure 11E:
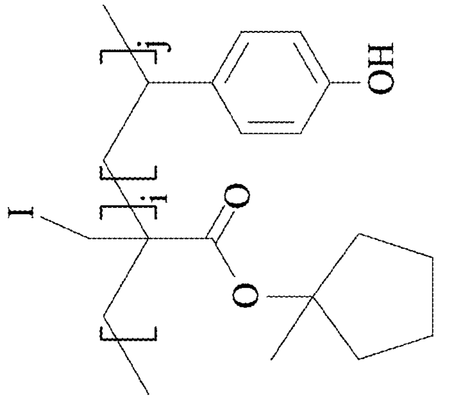
Figure 11F:
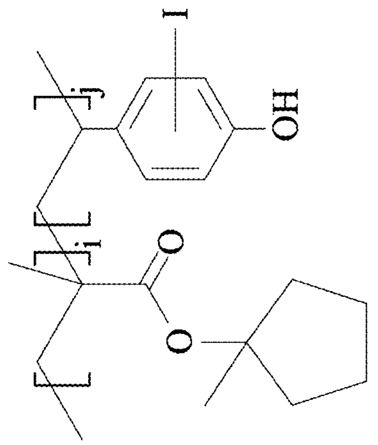
Figure 11G:
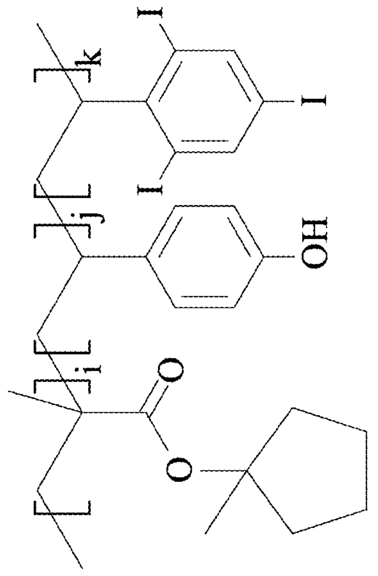
Figure 11H:
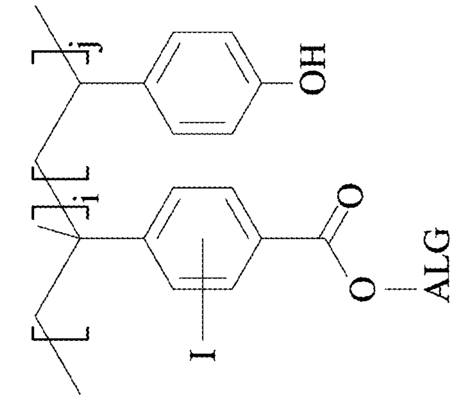

FIGS. 11D, 11E, 11F, 11G, 11H, 11I, 11J, 11K, and 11L illustrate examples of polymers in photoresist compositions according to some embodiments of the disclosure. In some embodiments, an iodo-sensitizer group is attached to an acid labile group, as shown in FIG. 11D. In some embodiments, an iodo-sensitizer group is attached to the main chain of the polymer, as shown in FIG. 11E. In some embodiments, the main chain of the polymer is a polymethyl methacrylate/polyhydroxystyrene copolymer. In some embodiments, an iodine or iodo group is attached to the polyhydroxystyrene unit of the polymethyl methacrylate/polyhydroxystyrene copolymer, as shown in FIG. 11F. In some embodiments, the iodo-sensitizer group is a monomer unit in a polymethyl methacrylate/polyhydroxystyrene copolymer, as shown in FIG. 11G. In other embodiments, the iodo-sensitizer group is located on the polymethyl methacrylate unit of the polymethyl methacrylate/polyhydroxystyrene copolymer, between the main polymer chain and the acid labile group, as shown in FIG. 11H.

Figure 11I:
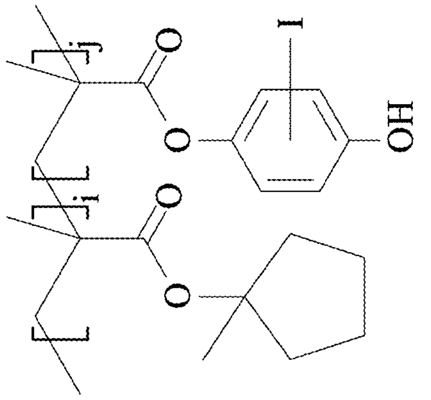
Figure 11J:
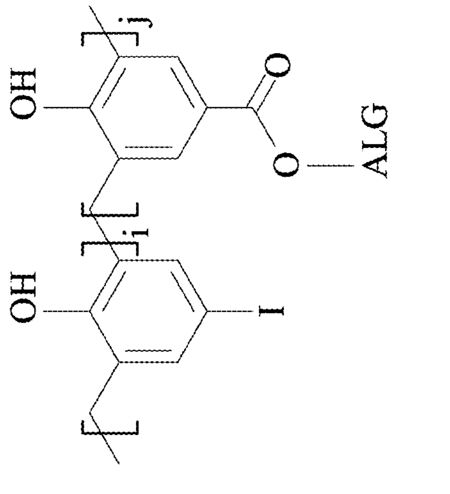
Figure 11K:
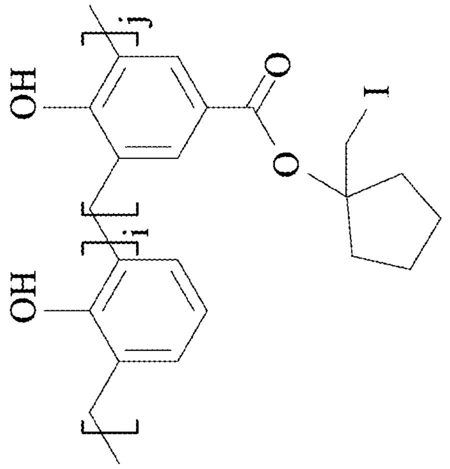

In other embodiments, the polymer is a polymethyl methacrylate polymer where the iodo-sensitizer group is attached to a methyl methacrylate monomer unit via the ester linkage, as shown in FIG. 11I. In other embodiments, the polymer is a novolac copolymer, and the iodo-sensitizer group is a monomer unit of the novolac copolymer, as shown in FIG. 11J. In some embodiments, another monomer unit of the novolac copolymer includes an acid labile group (ALG), as shown in FIG. 11J. In some embodiments, iodine or an iodo-sensitizer group is attached to acid labile group. For example, as shown in FIG. 11K, an iodine is attached to an acid labile group on a novolac polymer.

Figure 11L:
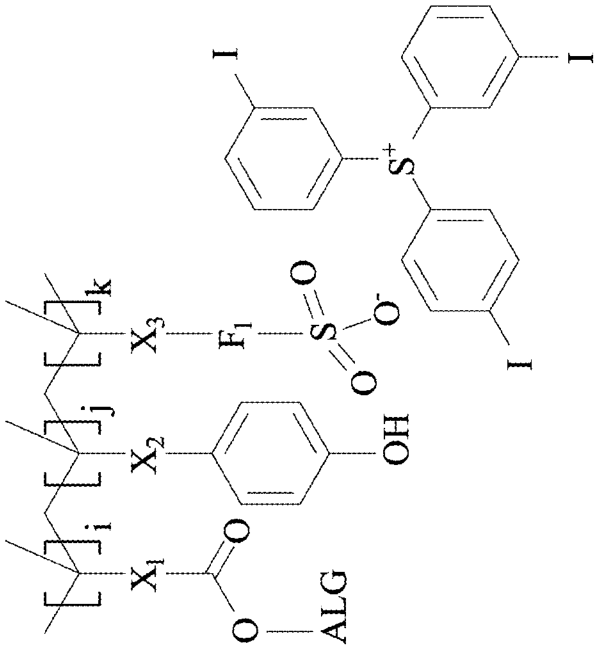

In some embodiments, the polymer in the photoresist composition includes a photoacid generator (PAG) attached to the polymer. In some embodiments, iodine or an iodo-sensitizer group is attached a PAG bound to the polymer. In some embodiments, the polymer is a polymethyl methacrylate/polyhydroxystyrene copolymer including PAG monomer units, as shown in FIG. 11L. For example, as shown in FIG. 11L, in some embodiments, a triphenyl sulfonium group includes iodine bonded to the phenyl groups of triphenyl sulfonium group.

In some embodiments, the polymer includes groups that can assist in increasing the adhesiveness of the photoresist layer 15 to underlying structures (e.g., substrate 10). Polar groups may be used to increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group that will decompose includes structures such as 1-adamantyl(meth)acrylate, tricyclodecanyl (meth)acrylate, cyclohexyl (methacrylate), combinations of these, or the like.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments, the cross-linking agent is selected from

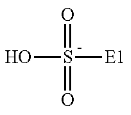 or 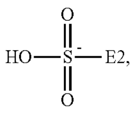

where E1 is selected from the group consisting of polar groups or a bulky group. In some embodiments, the polar group is a hydroxyl group. In some embodiments, the bulky group includes sterically hindering substituted and unsubstituted cycloalkanes, lactones, and 3-D structures. In some embodiments, E2 is an acid labile group. In some embodiments, the 3-D structures are selected from one or more of norbornyl, adamantyl, basketanyl, twistanyl, cubanyl, and dodecahedranyl groups. In some embodiments, the cycloalkanes, lactones, or 3-D structures are substituted with a halogen, including F, Cl, or Br. In some embodiments, the bulky group, polar group, or acid labile group modifies the solubility and diffusion length of the cross-linking agent anions.

In other embodiments the cross-linking agent has the following structure:

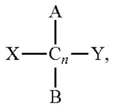

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

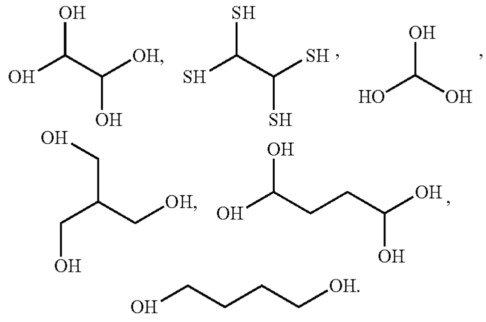

Alternatively, instead of or in addition to the cross-linking agent being added to the photoresist composition, a coupling reagent is added in some embodiments. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

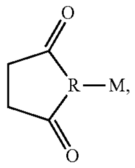

where R is a carbon atom, a nitrogen atom, a sulfur atom, or an oxygen atom; M includes a chlorine atom, a bromine atom, an iodine atom, —$NO_2$; —$SO_3$—; —H—; —CN; —NCO, —OCN; —$CO_2$—; —OH; —OR*, —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

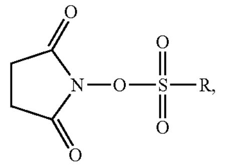
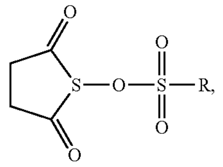
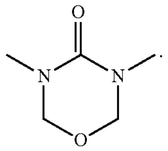

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs can be evenly dissolved into the solvent and dispensed upon the layer to be patterned.

A quencher is added to some embodiments of the photoresist composition to inhibit diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof, including its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof, including its esters, such as phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and arylammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment, bile-salt esters may be used as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2',4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, naphthalene black, Photopia methyl violet, bromophenol blue and bromocresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent, such as a carboxyl group, a methacryloyl group, an isocyanate group, or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

The photoresist composition includes a solvent in some embodiments. The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), 7-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the polymer resin, sensitizer, and the PACs, along with any desired additives or other agents, are added to the solvent for application. Once added, the mixture is then mixed in order to achieve a homogenous composition throughout the photoresist composition to ensure that there are no defects caused by uneven mixing or nonhomogenous composition of the photoresist. Once mixed together, the photoresist may either be stored prior to its usage or used immediately.

Once ready, the photoresist composition is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-exposure bake of the photoresist layer 15 is performed in some embodiments to cure and dry the photoresist prior to radiation exposure (see FIG. 1, operation S120). The curing and drying of the photoresist layer 15 removes the solvent component while leaving behind the polymer resin, the PACs, and the other chosen additives. In some embodiments, the pre-exposure baking is performed at a temperature suitable to evaporate the solvent, such as between about 40° C. and 120° C., although the precise temperature depends upon the materials chosen for the photoresist composition. The pre-baking is performed for a time sufficient to cure and dry the photoresist layer, such as between about 10 seconds to about 10 minutes.

FIGS. 3A and 3B illustrate selective exposure or pattern-wise exposure of the photoresist layer to form an exposed region 50 and an unexposed region 52. In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15 to induce a reaction of the sensitizers and PACs to generate acids, which in turn react with the polymer to chemically alter those regions of the photoresist layer to which the radiation 45/97 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beam, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In an embodiment, the patterned radiation 45/97 is extreme ultraviolet light having a 13.5 nm wavelength, the PAC is a photoacid generator, the group to be decomposed is a carboxylic acid group on the hydrocarbon structure, and a cross linking agent is used. The patterned radiation 45/97 impinges upon the sensitizer and photoacid generator. The sensitizer and the photoacid generator absorb the impinging patterned radiation 45/97. The sensitizer releases a secondary electron or higher wavelength radiation, which is subsequently absorbed by the photoacid generator. This absorption initiates the photoacid generator to generate a proton (e.g., a $H^+$ ion) within the photoresist layer 15.

In some embodiments, the proton impacts a carboxylic acid group protected by one of the groups to be removed/acid labile groups. The groups to be removed are removed in a de-protecting reaction, which is initiated by a proton $H^+$ generated by, e.g., the photoacid generator during either the exposure process or during the post-exposure baking process. The $H^+$ first removes the groups to be removed/acid labile groups and another hydrogen atom may replace the removed structure to form a de-protected polymer. Once de-protected, a crosslinking reaction occurs between two separate de-protected polymers that have undergone the de-protecting reaction and the crosslinker or crosslinking groups in a crosslinking reaction. In particular, hydrogen atoms within the carboxylic groups formed by the de-protecting reaction are removed and the oxygen atoms react with and bond with the crosslinker or the crosslinking group. This bonding of the crosslinker or crosslinking group to two polymers bonds the two polymers to each other through the crosslinker or crosslinking group, thereby forming a cross-linked polymer.

By increasing the molecular weight of the polymers through the cross-linking reaction, the new cross-linked polymer becomes less soluble in conventional organic solvent negative resist developers.

In other embodiments, the proton released by the photoacid generator reacts with an acid-labile group causing decomposition of the acid-labile group and replacement of the acid-labile group with a hydroxyl group, thereby changing the solubility of the exposed regions of the photoresist layer. For example, the formation of hydroxyl groups may make the polymer more soluble in aqueous-based developers, such as TMAH-based developers.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45/97, a post-exposure baking is performed in some embodiments to assist in the generating, dispersing, and reacting of the acid generated from the impingement of the radiation 45/97 upon the PACs during the exposure (see FIG. 1, operation S140). Such thermal assistance helps to create or enhance chemical reactions that generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 50° C. to about 160° C. for a period of between about 20 seconds and about 10 minutes.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-exposed regions 50 of a positive tone photoresist composition in some embodiments, exposing the surface of the substrate 10, as shown in FIG. 5A, and leaving behind well-defined unexposed photoresist regions 52, having improved definition than provided by conventional photoresist photolithography. In other embodiments, the developer 57 dissolves the radiation-unexposed regions 52 of a negative tone photoresist composition exposing the surface of the substrate 10, as shown in FIG. 5B, and leaving behind well-defined exposed photoresist regions 50, having improved definition than provided by conventional photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the photoresist pattern 50, 52 is in place. For example, an etching operation, using dry or wet etching, is performed in some embodiments, to transfer the pattern of the photoresist layer 50, 52 to the underlying substrate 10, forming recesses 55*a*', 55*b*' as shown in FIGS. 6A and 6B. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 12:
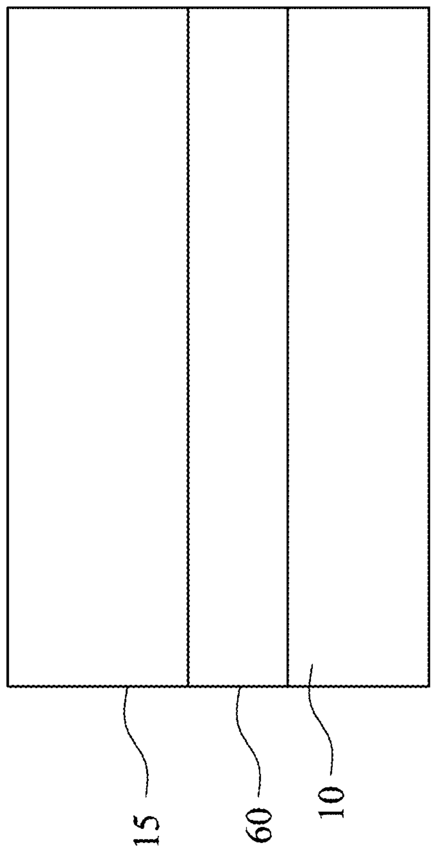
FIG. 12 shows a process stage of a sequential operation according to an embodiment of the disclosure.

In some embodiments, a layer to be patterned 60 is disposed over the substrate prior to forming the photoresist layer, as shown in FIG. 12. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 13A:
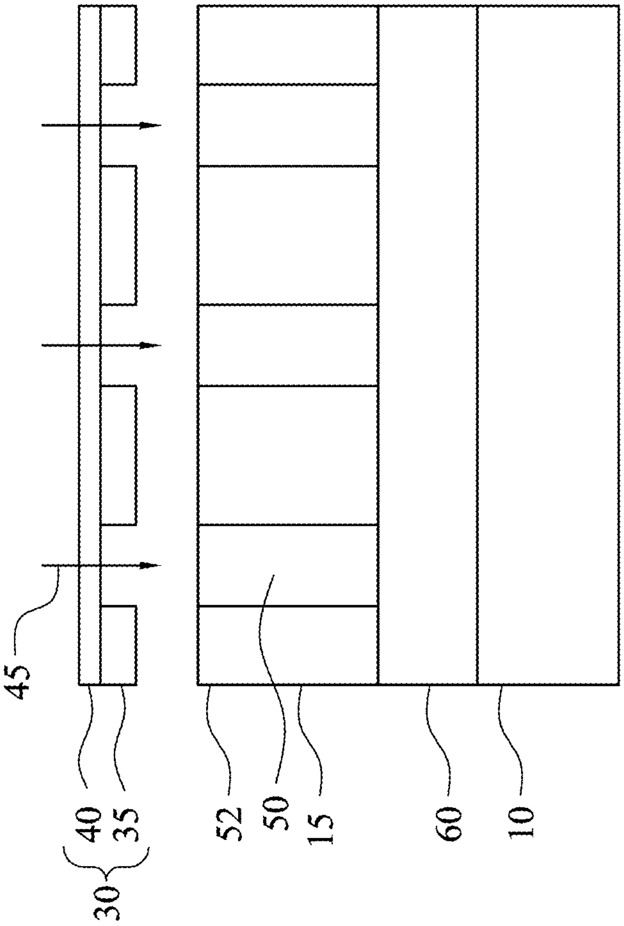
FIGS. 13A and 13B show a process stage of a sequential operation according to an embodiment of the disclosure.
Figure 13B:
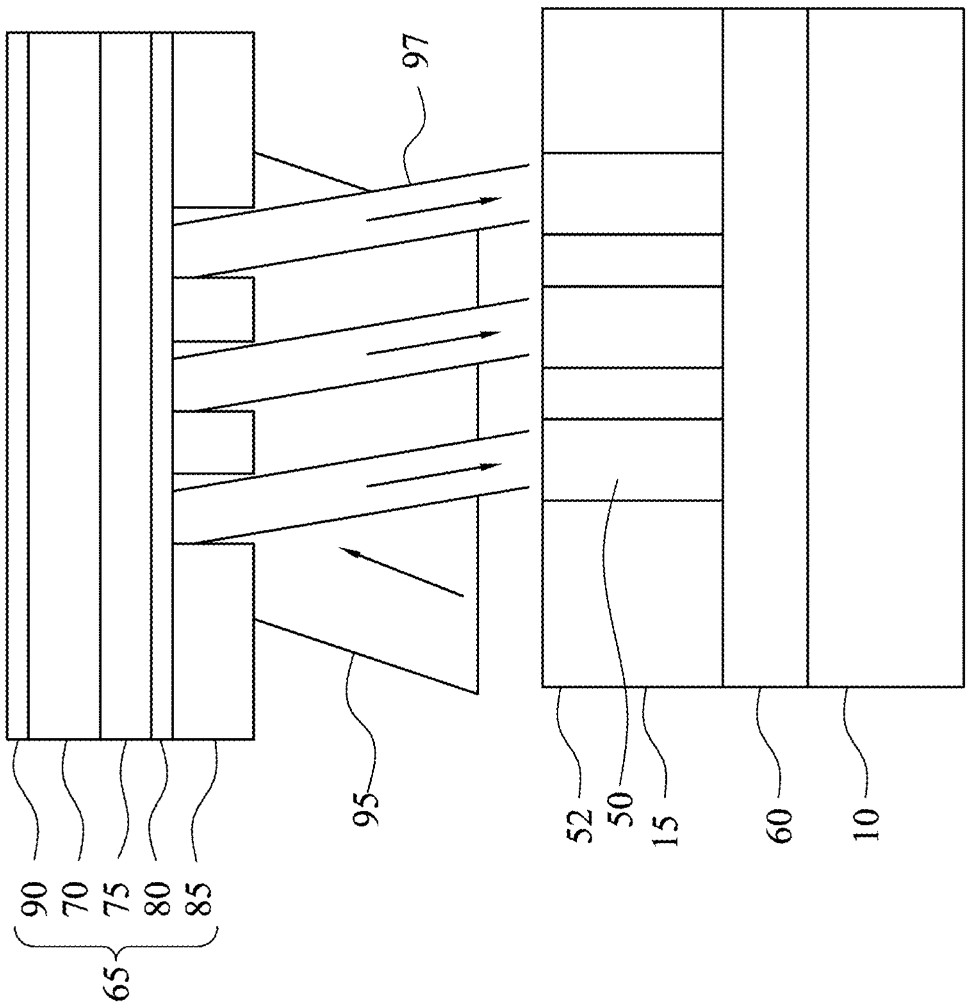

The photoresist layer 15 is subsequently selectively exposed or patternwise exposed to actinic radiation 45 to form exposed regions 50 and unexposed regions 52 in the photoresist layer, as shown in FIGS. 13A and 13B, and described herein in relation to FIGS. 3A and 3B. As explained herein the photoresist is a positive tone photoresist in some embodiments.

Figure 14:
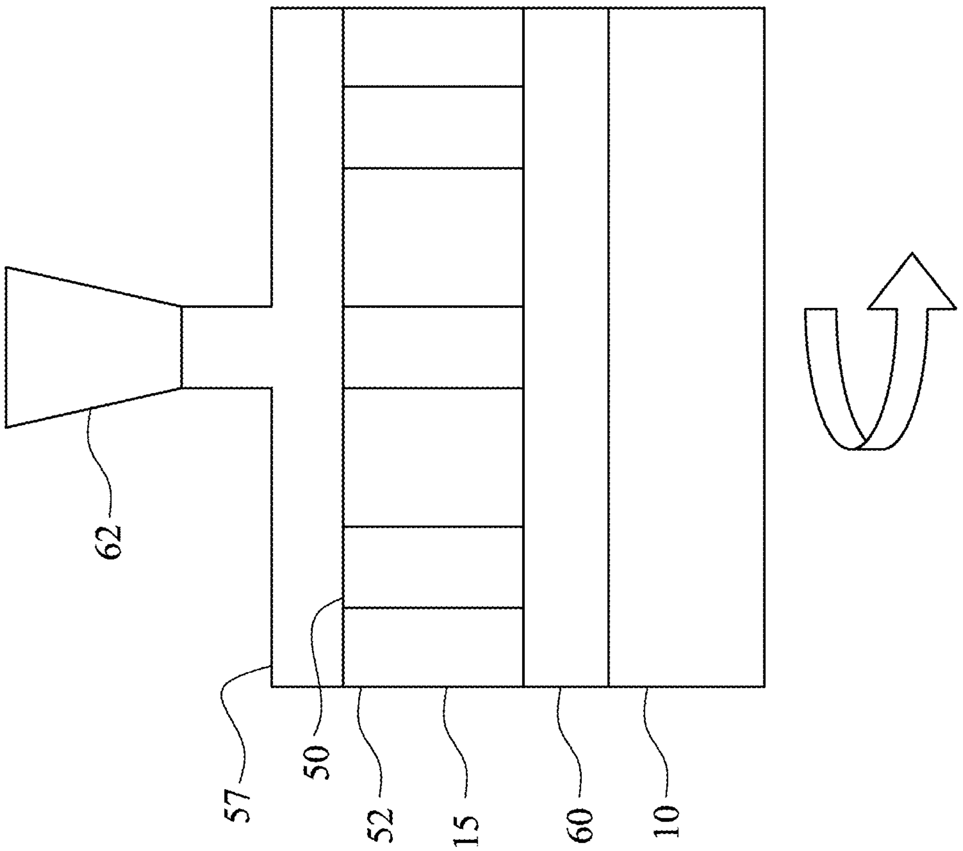
FIG. 14 shows a process stage of a sequential operation according to an embodiment of the disclosure.
Figure 15A:
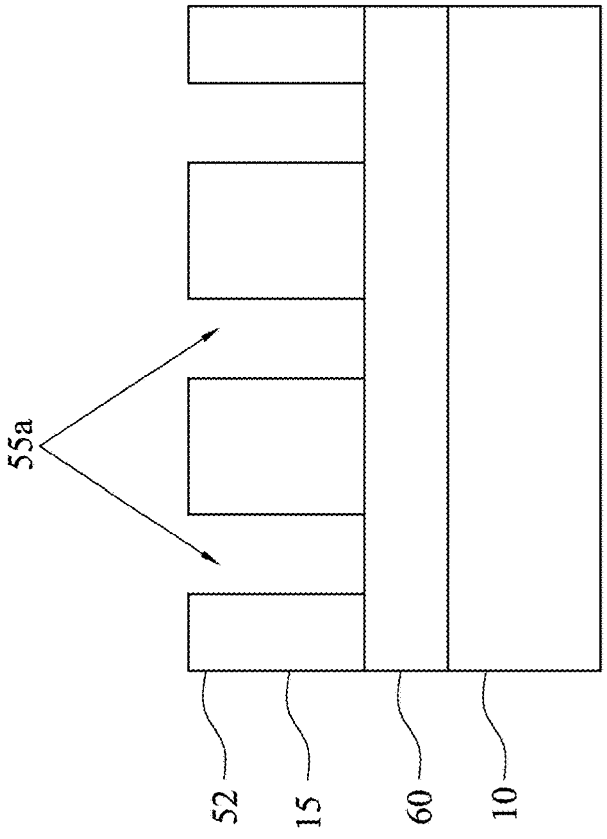
FIGS. 15A and 15B show a process stage of a sequential operation according to an embodiment of the disclosure.
Figure 15B:
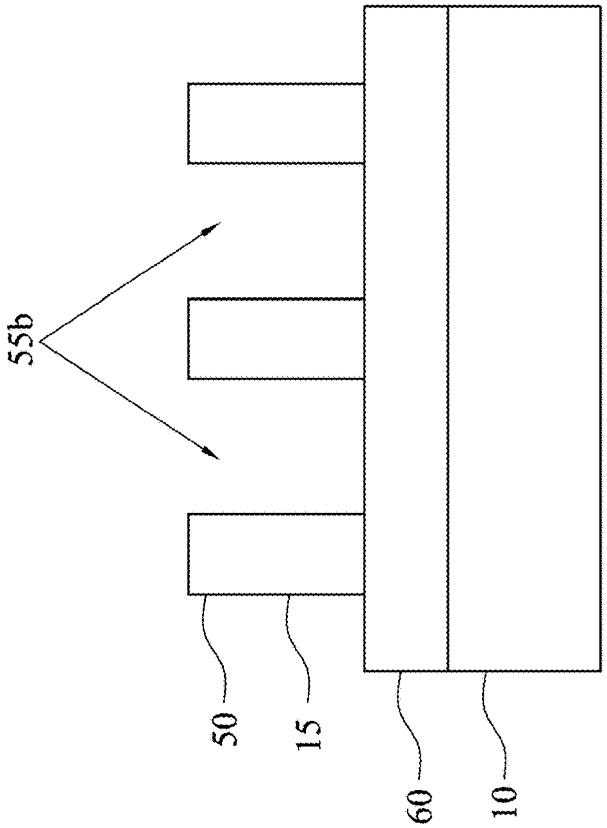

As shown in FIG. 14, the selectively exposed or patternwise exposed photoresist layer 15 is developed by dispensing developer 57 from a dispenser 62 to form a pattern of photoresist openings 55*a*, 55*b*, as shown in FIGS. 15A and 15B. FIG. 15A illustrates the development of a positive tone photoresist, and FIG. 15B illustrates the development of a negative tone photoresist. The development operation is similar to that explained with reference to FIGS. 4, 5A, and 5B, herein.

Figure 16B:
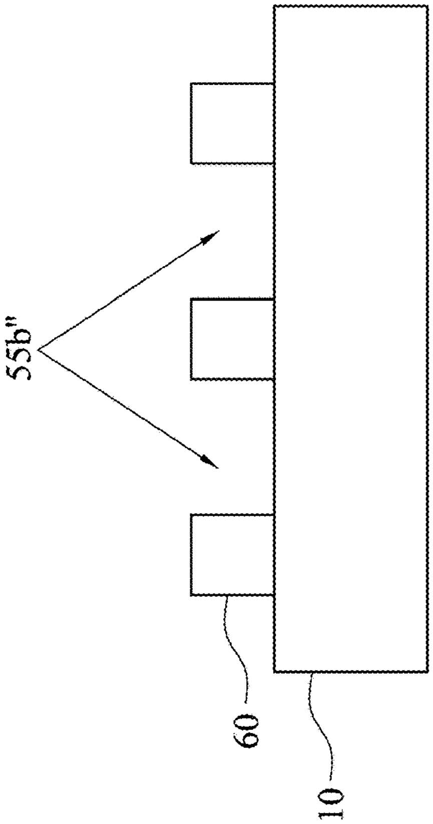
FIGS. 16A and 16B show a process stage of a sequential operation according to an embodiment of the disclosure.
Figure 16A:
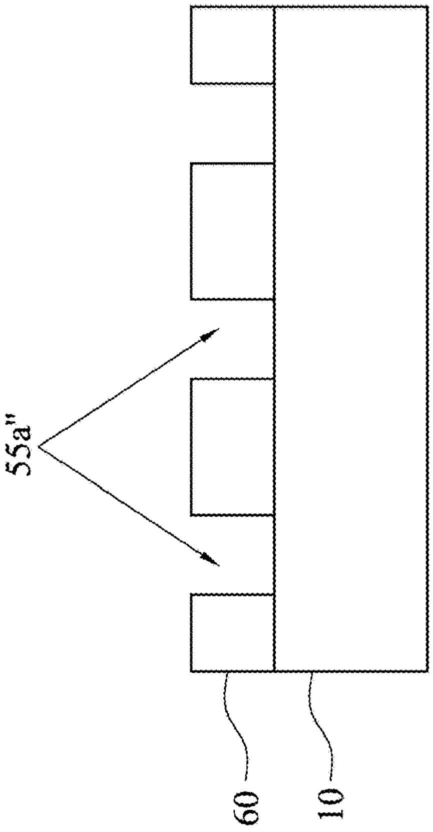

Then, as shown in FIGS. 16A and 16B, the pattern 55*a*, 55*b* in the photoresist layer 15 is transferred to the layer to be patterned 60 using an etching operation and the photoresist layer is removed, as explained with reference to FIG. 7 to form pattern 55*a*", 55*b*" in the layer to be patterned 60.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel photoresist compositions and methods according to the present disclosure provide higher semiconductor device feature resolution and density at higher wafer exposure throughput with reduced defects in a higher efficiency process than conventional exposure techniques. The novel photoresist compositions provide improved solubility of the photoresist components in the photoresist composition. Embodiments of the disclosure reduce photoresist scum and photoresist bridging issues. The photoresist compositions and methods of the present disclosure provide improved line width roughness for pattern features having a critical dimension of less than 50 nm and having a pattern pitch of less than 100 nm.

An embodiment of the disclosure is a method for manufacturing a semiconductor device, including forming a photoresist layer including a photoresist composition. The photoresist layer is selectively exposed to actinic radiation to form a latent pattern, and the latent pattern is developed by applying a developer to the selectively exposed photoresist layer to form a pattern. The photoresist composition includes: an iodine-containing sensitizer, a photoactive compound, and a polymer. The iodine-containing sensitizer includes one or more of ammonium iodides, phosphonium iodides, heterocyclic ammonium iodides,

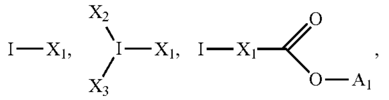

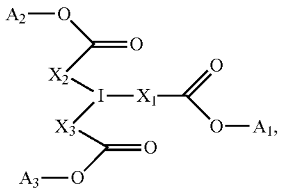

$I^-$ or

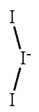

-continued

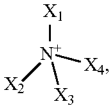

and $I^-$ or

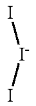

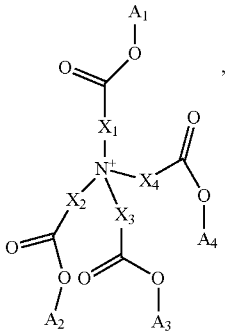

, where $X_1$, $X_2$, $X_3$, and $X_4$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring, or a C3-C30 iodo-heterocyclic group; $A_1$, $A_2$, $A_3$, and $A_4$ are independently an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group. In an embodiment $X_1$, $X_2$, $X_3$, and $X_4$ are independently linked to any of $A_1$, $A_2$, $A_3$, and $A_4$ by a (COO). In an embodiment, the actinic radiation is extreme ultraviolet radiation. In an embodiment, after selectively exposing the photoresist layer to actinic radiation to form a latent pattern and before developing the latent pattern the method includes heating the photoresist layer. In an embodiment, $X_1$, $X_2$, $X_3$, $X_4$, $A_1$, $A_2$, $A_3$, and $A_4$ are independently a chain group, a cyclic group, or a 3-D group. In an embodiment, the iodides are triiodides. In an embodiment, the iodine-containing sensitizer is one or more of:

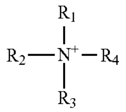

$I^-$,

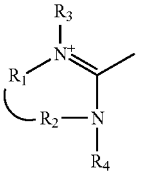

$I^-$,

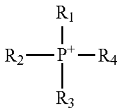

$I^-$,

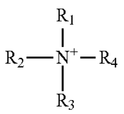

$^-$[I-I-I],

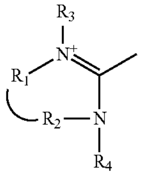

$^-$[I-I-I], and

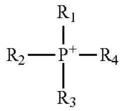

[I-I-I], where $R_1$, $R_2$, $R_3$, and $R_4$ are independently a C2-C15 alkyl group, a C3-C15 cycloalkyl group, a C1-C15 hydroxylalkyl group, a C2-C15 alkoxy group, a C3-C15 alkoxyl alkyl group, a C1-C15 acetyl group, a C2-C15 acetylalkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 heterocyclic group, or $R_1$ and $R_2$ form a ring. In an embodiment, $R_1$, $R_2$, $R_3$, and $R_4$ are independently a chain, a ring, or 3-D structure. In an embodiment, the iodine-containing sensitizer is one or more of.

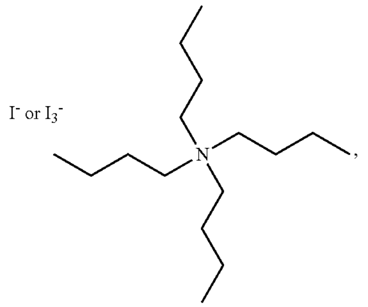
,

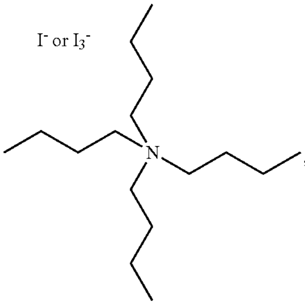
, or

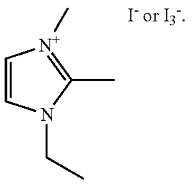
.

Another embodiment of the disclosure is a method for manufacturing a semiconductor device, including forming a photoresist layer comprising a photoresist composition. The photoresist layer is patternwise exposed to actinic radiation and the patternwise exposed photoresist layer is developed by applying a developer to form a pattern. The photoresist composition includes: a sensitizer, a photoactive compound, and a polymer. The photoactive compound is an iodonium compound having a structure:

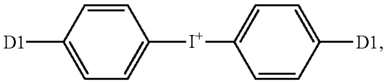
, where D1 is one or more of sterically hindering substituted and unsubstituted cycloalkanes, lactones, and 3-D structures. In an embodiment, the sensitizer is an iodine-containing sensitizer. In an embodiment, the 3-D structures are one or more of norbornyl, adamantyl, basketanyl, twistanyl, cubanyl, and dodecahedranyl groups. In an embodiment, the photoresist composition includes a cross-linking agent. In an embodiment, the cross-linking agent is selected from

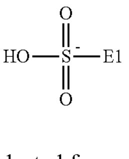
or
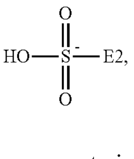
, where E1 is selected from polar groups, sterically hindering substituted and unsubstituted cycloalkanes, lactones, and 3-D structures, and E2 is an acid labile group. In an embodiment, the polymer includes iodine or an iodo group attached to the polymer. In an embodiment, the polymer includes one or more of

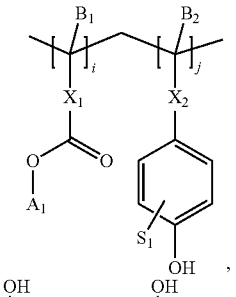
,

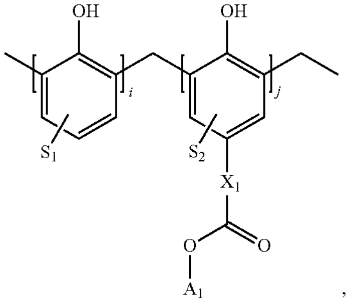
, and

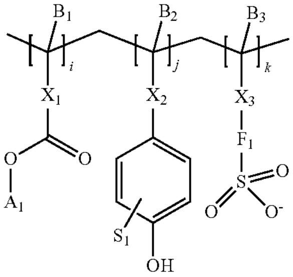

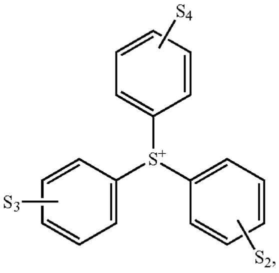
, where $X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring or a C3-C30 iodo-heterocyclic group; $A_1$ is an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group; $B_1$, $B_2$, and $B_3$ are independently H, I, a C1-C3 alkyl group, or a C1-C3 iodo-alkyl group; $S_1$, $S_2$, $S_3$, and $S_4$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group; $F_1$ is a C1-C5 fluorocarbon or a C1-C5 iodo-fluorocarbon; and 0 mol %≤i≤100 mol %, 0 mol %≤j≤100 mol %, 0 mol %≤k≤100 mol %, and 0<i+j+k≤100 mol %.

Another embodiment of the disclosure is a photoresist composition, including an iodine-containing sensitizer, a photoactive compound, and a polymer. The iodine-containing sensitizer includes one or more of ammonium iodides, phosphonium iodides, heterocyclic ammonium iodides,

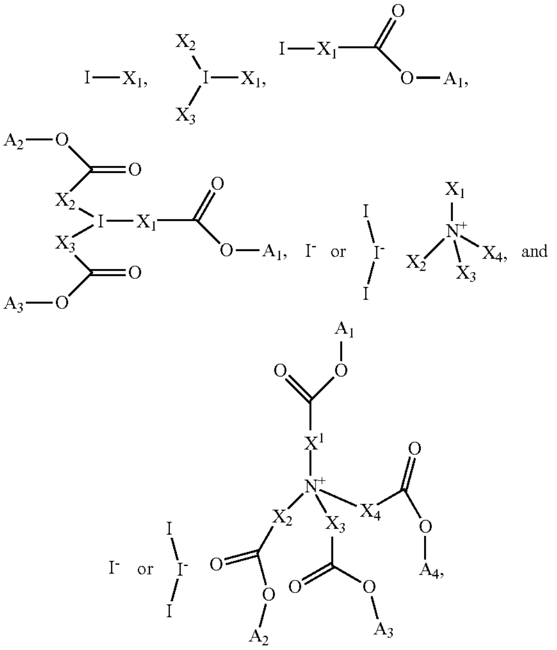

where $X_1$, $X_2$, $X_3$, and $X_4$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group, a C3-C30 saturated or unsaturated iodo-hydrocarbon ring, or a C3-C30 iodo-heterocyclic group; $A_1$, $A_2$, $A_3$, and $A_4$ are independently an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group. In an embodiment $X_1$, $X_2$, $X_3$, and $X_4$ are independently linked to any of $A_1$, $A_2$, $A_3$, and $A_4$ by a (COO). In an embodiment, $X_1$, $X_2$, $X_3$, $X_4$, $A_1$, $A_2$, $A_3$, and $A_4$ are independently a chain group, a cyclic group, or a 3-D group. In an embodiment, the iodides are triiodides. In an embodiment, the iodine-containing sensitizer is one or more of:

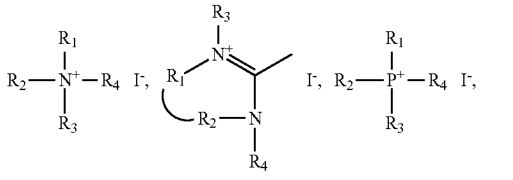

-continued

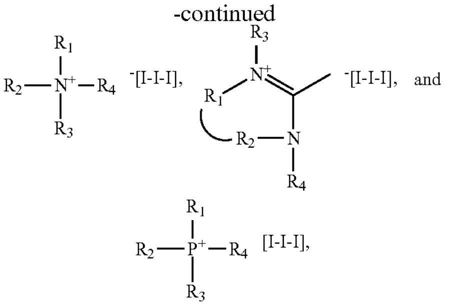

where $R_1$, $R_2$, $R_3$, and $R_4$ are independently a C2-C15 alkyl group, a C3-C15 cycloalkyl group, a C1-C15 hydroxylalkyl group, a C2-C15 alkoxy group, a C3-C15 alkoxyl alkyl group, a C1-C15 acetyl group, a C2-C15 acetylalkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 heterocyclic group, or $R_1$ and $R_2$ can form a ring. In an embodiment, $R_1$, $R_2$, $R_3$, and $R_4$ are independently a chain, a ring, or 3-D structure. In an embodiment, the iodine-containing sensitizer is one or more of:

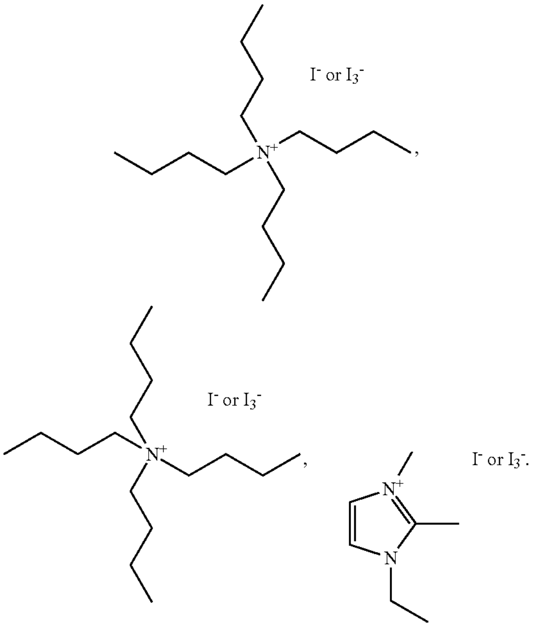

In an embodiment, the iodine-containing sensitizer is one or more of ammonium iodide, ammonium triiodide, tetra-methyl ammonium triiodide, benzyl(trimethyl) ammonium iodide, tetra-methyl ammonium iodide, tetra-butyl ammonium iodide, tetra-butyl ammonium triiodide, (v-phenenyl-tris(oxyethylene))tris(trimethyl) ammonium triiodide, triethyl(2-(2-pyridyl)ethyl)ammonium iodide, (tri-methyl) phenyl-ammonium iodide, (2-hydroxy-1,1-dimethyl-ethyl)-methyl-ammonium iodide, [3-(1-adamantyl)-3-oxopropyl] (trimethyl)ammonium iodide, iodobenzene, tri-iodobenzene, [bis(trifluoroacetoxy)iodo]benzene, [(N-tosylimino)iodo]benzene, [hydroxy-(2,4-dinitrobenzenesulfonyloxy)iodo]benzene, hydroxy (tosyloxy)iodo]benzene, iopamidol, 1-ethoxy-4-iodo-benzene, 1,2,4,5-tetrakis(4-tert-butylphenyl)-3,6-diiodobenzene, bis(trifluoroacetoxy)iodobenzene, 1,4-diiodo-2,5-bis(octyloxy)benzene, triiodothyronine, 1-N,3-N-bis(2,3-dihydroxypropyl)-5-[(2-hydroxyacetyl)-(2-hydroxyethyl) amino]-2,4,6-triiodobenzene-1,3 dicarboxamide, 1,4-diiodo-2,5-di(3-pentanyl)benzene 2,4,6-triiodobenzen-1,3,5-tricarboxylic acid, and 2-(1,1-diphenylpropoxy)-1,3,5-triiodobenzene. In an embodiment, the photoactive compound is a photoacid generator. In an embodiment, the photoacid generator is an iodonium compound. In an embodiment, the iodonium compound is

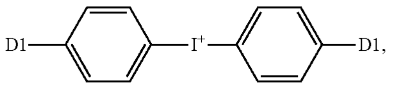

where D1 is one or more of sterically hindering substituted and unsubstituted cycloalkanes, lactones, and 3-D structures. In an embodiment, the 3-D structures are one or more of norbornyl, adamantyl, basketanyl, twistanyl, cubanyl, and dodecahedranyl groups. In an embodiment, the photoresist composition includes a cross-linking agent. In an embodiment, the cross-linking agent is selected from

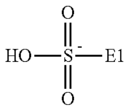 or 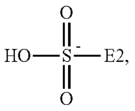

where E1 is one or more of polar groups, sterically hindering substituted and unsubstituted cycloalkanes, lactones, and 3-D structures, and E2 is an acid labile group. In an embodiment, the 3-D structures are one or more of norbornyl, adamantyl, basketanyl, twistanyl, cubanyl, and dodecahedranyl groups. In an embodiment, the polymer includes iodine or an iodo group attached to the polymer. In an embodiment, the polymer includes one or more of

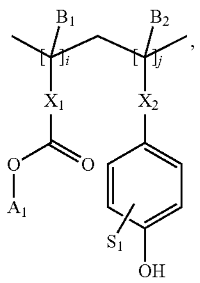

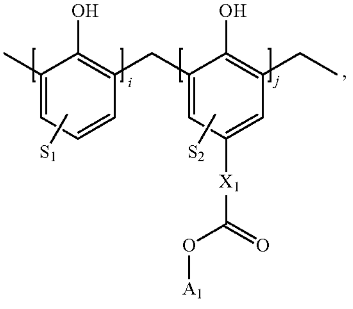 and

-continued

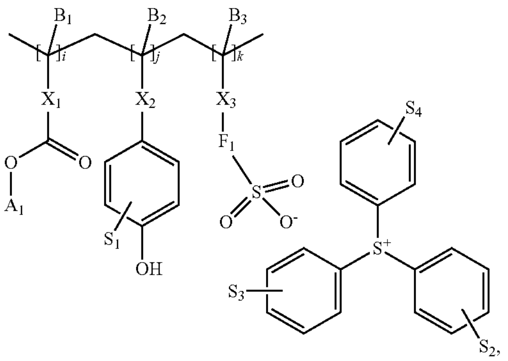

where $X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring or a C3-C30 iodo-heterocyclic group; $A_1$ is an acid labile group selected from one or more of a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group; $B_1$, $B_2$, and $B_3$ are independently H, I, a C1-C3 alkyl group, or a C1-C3 iodo-alkyl group; $S_1$, $S_2$, $S_3$, and $S_4$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group; $F_1$ is a C1-C5 fluorocarbon or a C1-C5 iodo-fluorocarbon; and 0 mol %≤i≤100 mol %, 0 mol %≤j≤100 mol %, 0 mol %≤k≤100 mol %, and 0<i+j+k≤100 mol %. In an embodiment, the polymer is one or more of

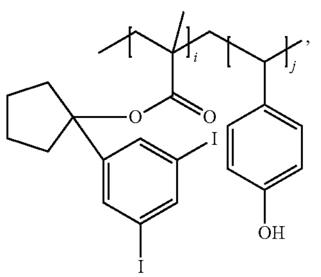

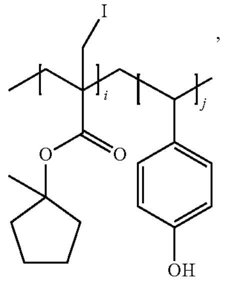

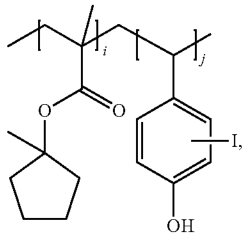

-continued

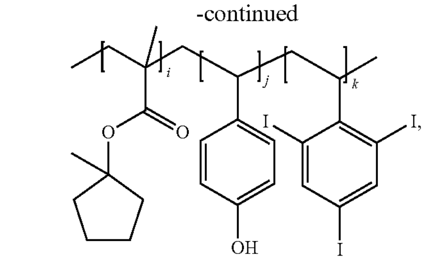

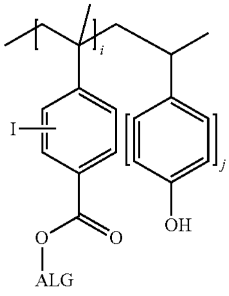

,

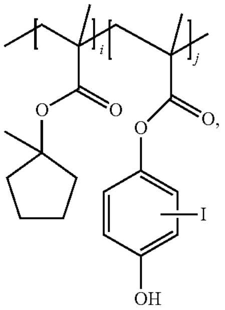

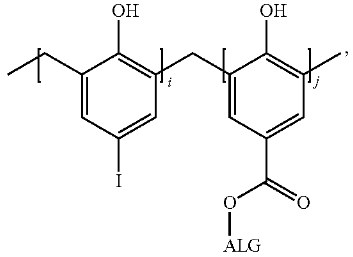

,

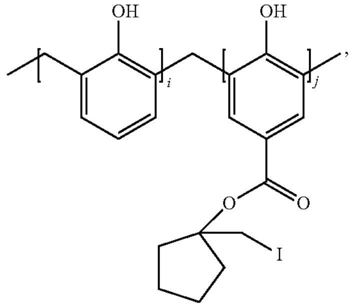

, and

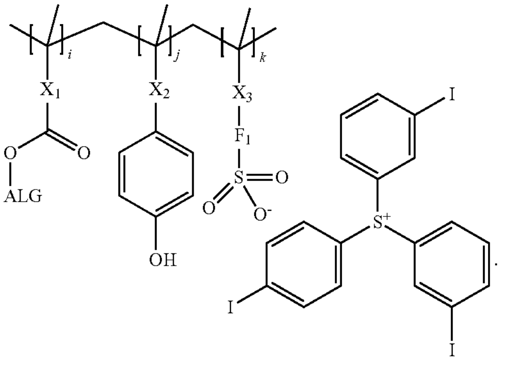

In an embodiment, the photoresist composition includes oxide nanoparticles and one or more organic ligands. In an embodiment, the photoresist composition includes one or more solvents.

Another embodiment of the disclosure is a photoresist composition, including a sensitizer, a photoactive compound, and a polymer. The photoactive compound is an iodonium compound having a structure

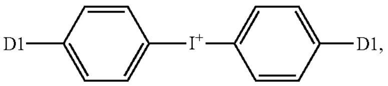

where D1 is one or more of sterically hindering substituted and unsubstituted cycloalkanes, lactones, and 3-D structures. In an embodiment, the sensitizer is an iodine-containing sensitizer. In an embodiment, the 3-D structures are one or more of norbornyl, adamantyl, basketanyl, twistanyl, cubanyl, and dodecahedranyl groups. In an embodiment, the photoresist composition includes a cross-linking agent. In an embodiment, the cross-linking agent is selected from

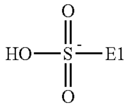

or

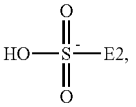

where E1 is one or more of polar groups, sterically hindering substituted and unsubstituted cycloalkanes, lactones, and 3-D structures, and E2 is an acid labile group. In an embodiment, the 3-D structures are one or more of norbornyl, adamantyl, basketanyl, twistanyl, cubanyl, and dodecahedranyl groups. In an embodiment, the polymer includes iodine or an iodo group attached to the polymer. In an embodiment, the polymer includes one or more of

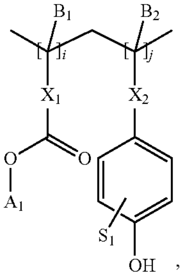

,

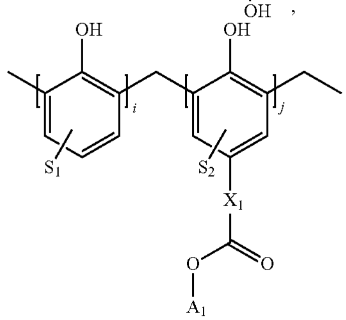

, and

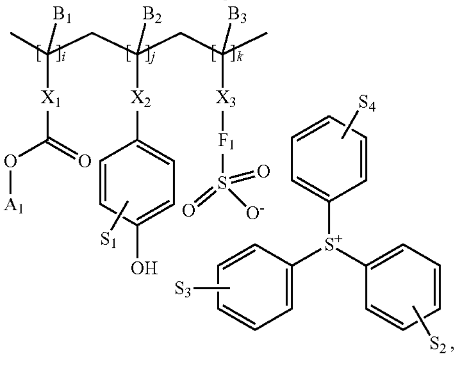

where $X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring or a C3-C30 iodo-heterocyclic group; $A_1$ is an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group; $B_1$, $B_2$, and $B_3$ are independently H, I, a C1-C3 alkyl group, or a C1-C3 iodo-alkyl group; $S_1$, $S_2$, $S_3$, and $S_4$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group; $F_1$ is a C1-C5 fluorocarbon or a C1-C5 iodo-fluorocarbon; and 0 mol %$<i<$100 mol %, 0 mol %$\leq j \leq$100 mol %, 0 mol %$\leq k \leq$100 mol %, and $0<i+j+k\leq$100 mol %. In an embodiment, the polymer is one or more of

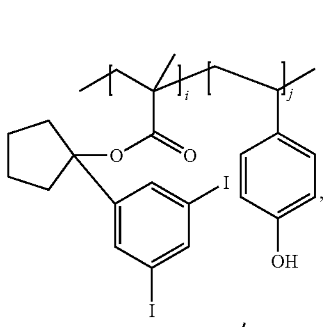

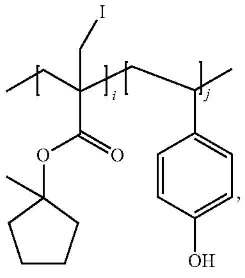

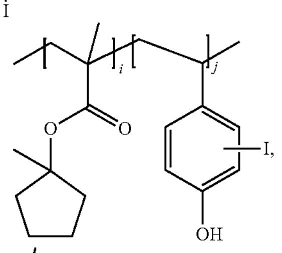

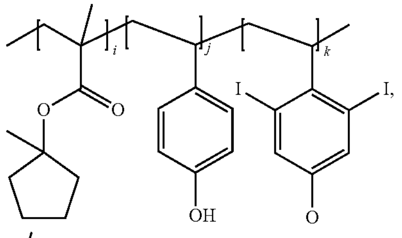

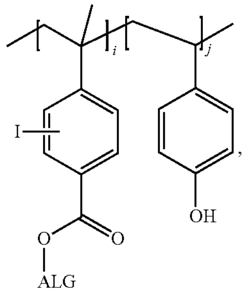

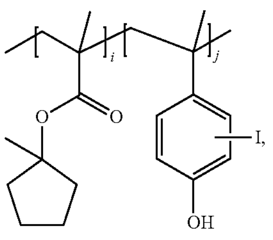

-continued

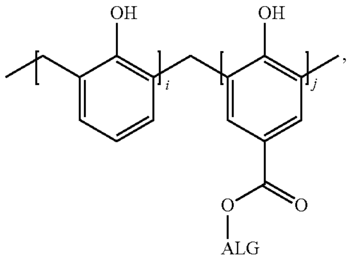

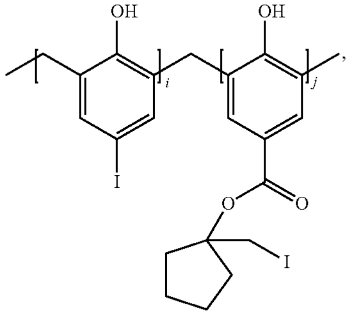

, and

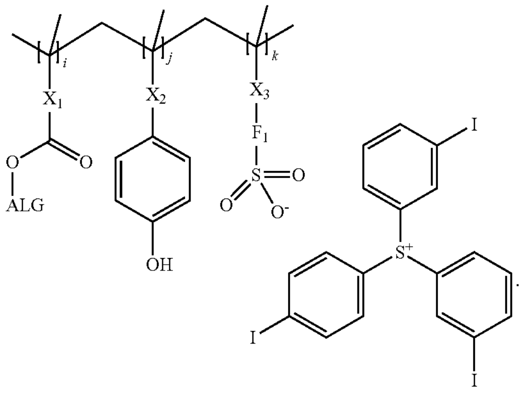

In an embodiment, the photoresist composition includes metal oxide nanoparticles and one or more organic ligands. In an embodiment, the photoresist composition includes one or more solvents.

Another embodiment of the disclosure is a photoresist composition, including a photoactive compound and a polymer, wherein the polymer includes iodine or an iodo group attached to the polymer. In an embodiment, the photoresist composition includes an iodine-containing sensitizer.

In an embodiment, the polymer includes one or more of

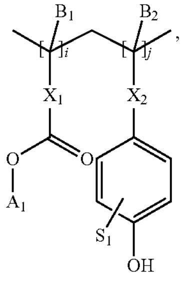

-continued

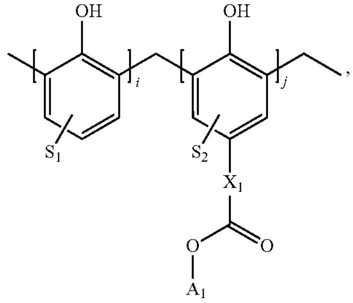

and

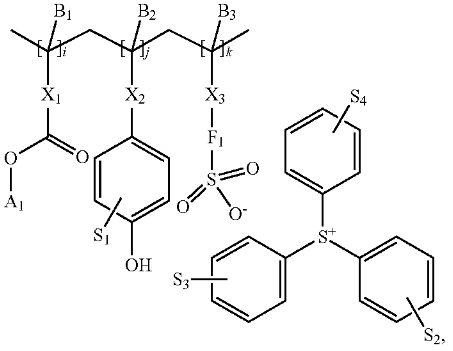

where $X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring or a C3-C30 iodo-heterocyclic group; $A_1$ is an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group; $B_1$, $B_2$, and $B_3$ are independently H, I, a C1-C3 alkyl group, or a C1-C3 iodo-alkyl group; $S_1$, $S_2$, $S_3$, and $S_4$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group; $F_1$ is a C1-C5 fluorocarbon or a C1-C5 iodo-fluorocarbon; and 0 mol $\%\leq i\leq 100$ mol %, 0 mol $\%\leq j\leq 100$ mol %, 0 mol $\%\leq k\leq 100$ mol %, and $0<i+j+k\leq 100$ mol %. In an embodiment, the polymer is one or more of

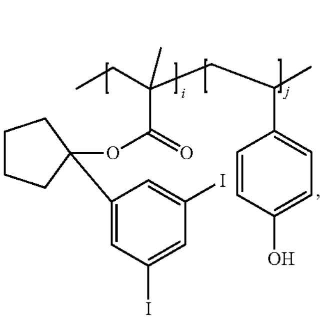

,

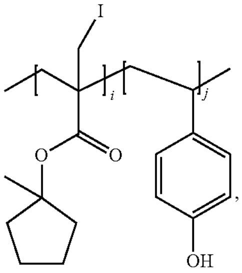

,

-continued

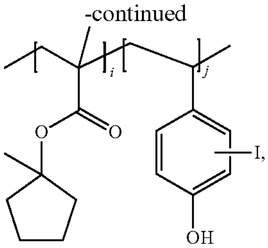

,

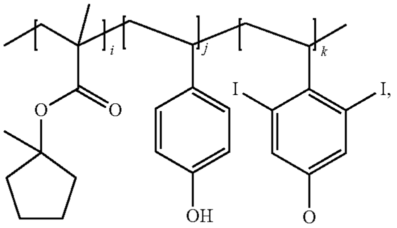

,

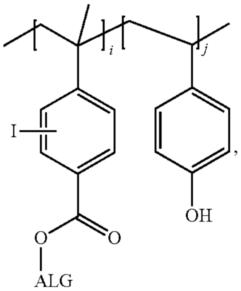

,

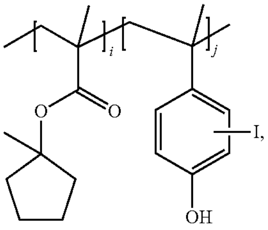

,

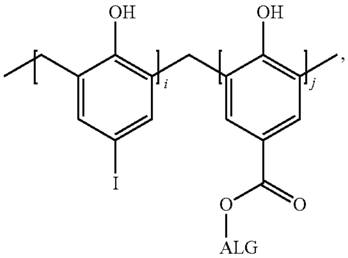

,

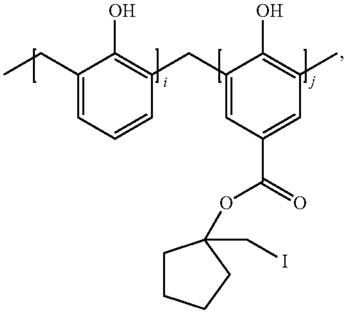

, and

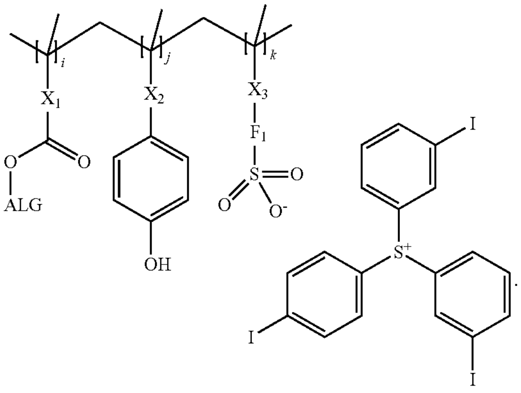

.

In an embodiment, the photoresist composition includes metal oxide nanoparticles and one or more organic ligands. In an embodiment, the photoresist composition includes one or more solvents.

Another embodiment of the disclosure is a method for manufacturing a semiconductor device, including forming a photoresist layer including a photoresist composition. The photoresist layer is selectively exposed to actinic radiation to form a latent pattern. The latent pattern is developed by applying a developer to the selectively exposed photoresist layer to form a pattern. The photoresist composition includes a photoactive compound; and a polymer, wherein the polymer includes iodine or an iodo group attached to the polymer. In an embodiment, the photoresist composition includes an iodine-containing sensitizer. In an embodiment, the polymer includes one or more of

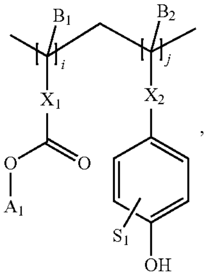

,

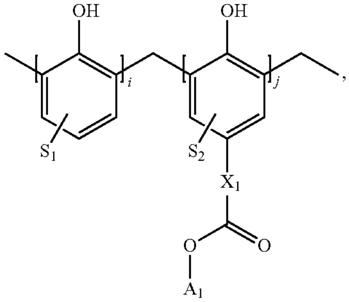

, and

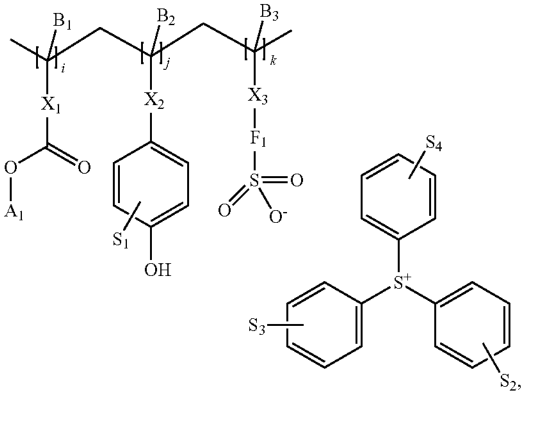

where $X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring or a C3-C30 iodo-heterocyclic group; $A_1$ is an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group; $B_1$, $B_2$, and $B_3$ are independently H, I, a C1-C3 alkyl group, or a C1-C3 iodo-alkyl group; $S_1$, $S_2$, $S_3$, and $S_4$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group; $F_1$ is a C1-C5 fluorocarbon or a C1-C5 iodo-fluorocarbon; and 0 mol %≤i≤100 mol %, 0 mol %≤j≤100 mol %, 0 mol %≤k≤100 mol %, and 0≤i+j+k≤100 mol %. In an embodiment, the polymer is one or more of

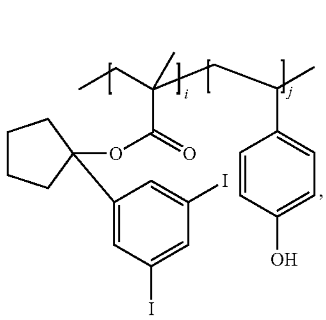

,

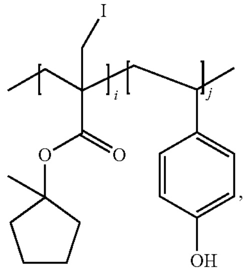

,

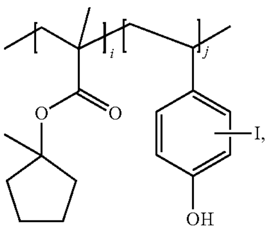

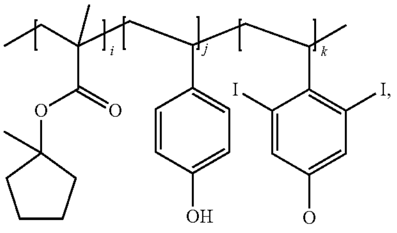

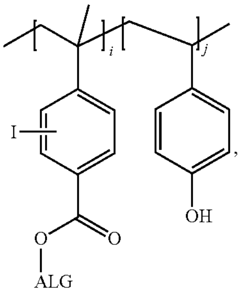

,

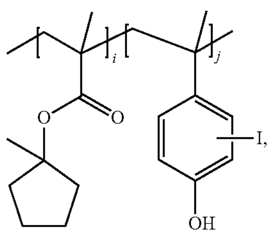

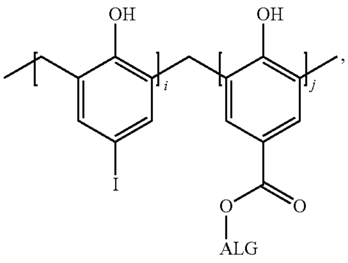

-continued

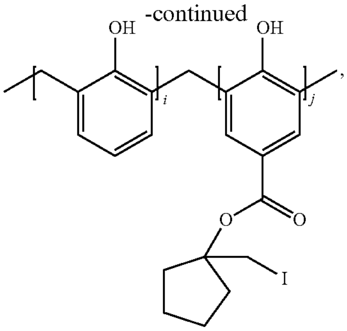

, and

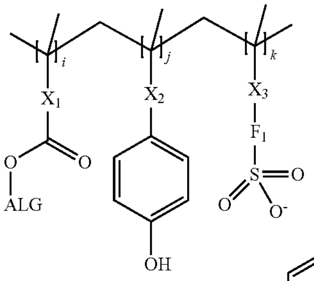

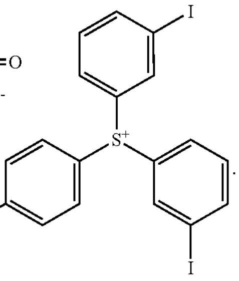

In an embodiment, the photoresist composition includes metal oxide nanoparticles and one or more organic ligands. In an embodiment, the photoresist composition includes one or more solvents.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a photoresist layer comprising a photoresist composition;

selectively exposing the photoresist layer to actinic radiation to form a latent pattern; and developing the latent pattern by applying a developer to the selectively exposed photoresist layer to form a pattern, wherein the photoresist composition comprises:

an iodine-containing sensitizer;

a photoactive compound; and a polymer, and wherein the iodine-containing sensitizer includes one or more of

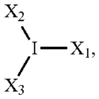

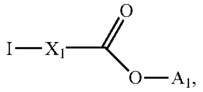

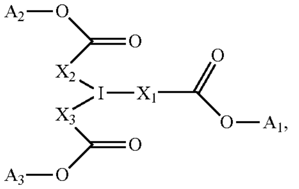

and

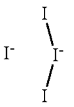

or

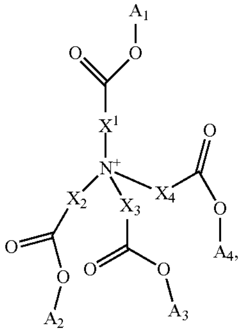

wherein when the iodine-containing sensitizer includes

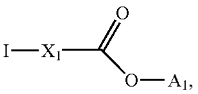

$X_1$ is a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alkyl carboxyl group, a C4-C30 iodo-cycloalkyl carboxyl group, a C3-C30 saturated or unsaturated iodo-hydrocarbon ring, or a C3-C30 iodo-heterocyclic group, when the iodine-containing sensitizer includes

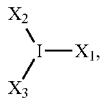

$X_1$, $X_2$, and $X_3$ are independently a, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alkyl carboxyl group, a C4-C30 iodo-cycloalkyl carboxyl group, or a C3-C30 iodo-heterocyclic group, when the iodine-containing sensitizer includes

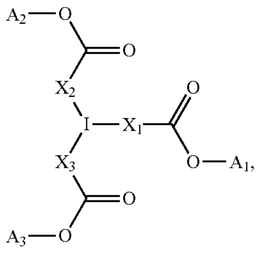

$X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alkyl carboxyl group, a C4-C30 iodo-cycloalkyl carboxyl group, a C3-C30 saturated or unsaturated iodo-hydrocarbon ring, or a C3-C30 iodo-heterocyclic group, and when the iodine-containing sensitizer includes $I^-$ or 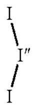 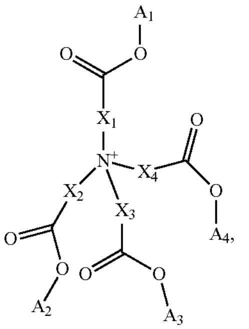

$X_1$, $X_2$, $X_3$, and $X_4$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alkyl carboxyl group, a C4-C30 iodo-cycloalkyl carboxyl group, a C3-C30 saturated or unsaturated iodo-hydrocarbon ring, or a C3-C30 iodo-heterocyclic group, $A_1$, $A_2$, $A_3$, and $A_4$ are independently an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group.

2. The method according to claim 1, wherein the actinic radiation is extreme ultraviolet radiation.

3. The method according to claim 1, further comprising after selectively exposing the photoresist layer to actinic radiation to form a latent pattern and before developing the latent pattern heating the photoresist layer.

4. The method according to claim 1, wherein $X_1$, $X_2$, $X_3$, $X_4$, $A_1$, $A_2$, $A_3$, and $A_4$ are independently a chain group, a cyclic group, or a 3-D group.

5. The method according to claim 1, wherein the iodides are triiodides.

6. The method according to claim 1, wherein the iodine-containing sensitizer further comprises one or more of:

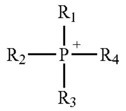 $I^-$ and 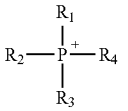 [I-I-I], where $R_1$, $R_2$, $R_3$, and $R_4$ are independently a C2-C15 alkyl group, a C3-C15 cycloalkyl group, a C1-C15 hydroxylalkyl group, a C2-C15 alkoxy group, a C3-C15 alkoxyl alkyl group, a C1-C15 acetyl group, a C2-C15 acetylalkyl group, a C1-C15 carboxyl group, a C2-C15 alkyl carboxyl group, a C4-C15 cycloalkyl carboxyl group, a C3-C15 saturated or unsaturated hydrocarbon ring, or a C2-C15 heterocyclic group.

7. The method according to claim 6, wherein $R_1$, $R_2$, $R_3$, and $R_4$ are independently a chain, a ring, or 3-D structure.

8. A method for manufacturing a semiconductor device, comprising:

forming a photoresist layer comprising a photoresist composition;

patternwise exposing the photoresist layer to actinic radiation; and developing the patternwise exposed photoresist layer by applying a developer to the patternwise exposed photoresist layer to form a pattern, wherein the photoresist composition comprises:

a sensitizer;

a photoactive compound; and a polymer, and wherein the photoactive compound is an iodonium compound having a structure:

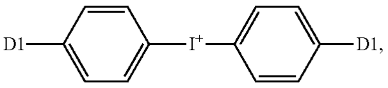

where D1 is one or more of sterically hindering substituted and unsubstituted cycloalkanes, lactones, and 3-D structures, wherein the polymer includes one or more of

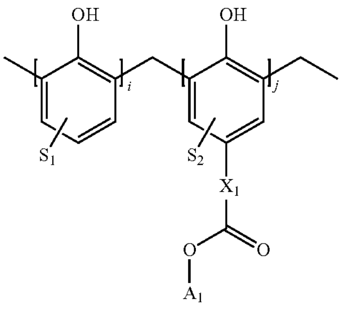 and

-continued

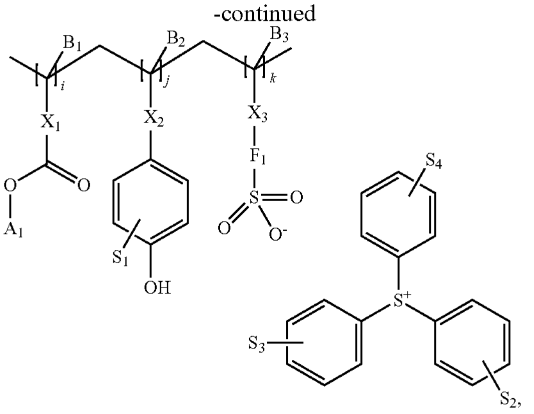

wherein when the polymer includes

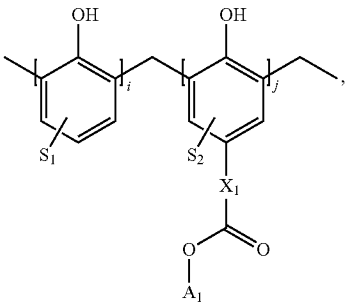

$X_1$ is a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, and a C4-C30 iodo-cycloalkyl carboxyl group; a C3-C30 saturated or unsaturated iodo-hydrocarbon ring or a C3-C30 iodo-heterocyclic group;

$A_1$ is an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group;

$S_1$ and $S_2$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group; and $0 \text{ mol } \% < i < 100 \text{ mol } \%$, $0 \text{ mol } \% < j < 100 \text{ mol } \%$, and $0 < i+j \leq 100 \text{ mol } \%$; and wherein when the polymer includes

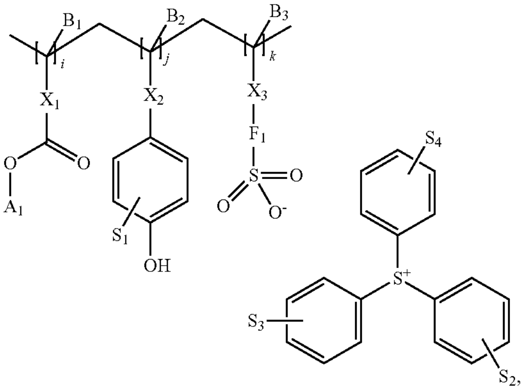

$X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alkyl carboxyl group, and a C4-C30 iodo-cycloalkyl carboxyl group; a C3-C30 saturated or unsaturated iodo-hydrocarbon ring or a C3-C30 iodo-heterocyclic group, wherein at least one of $X_1$, $X_2$, and $X_3$ is the C6-C30 iodo-aryl group, the C1-C30 iodo-alkyl group, the C3-C30 iodo-cycloalkyl group, the C1-C30 iodo-hydroxylalkyl group, the C2-C30 iodo-alkoxy group, the C3-C30 iodo-alkoxyl alkyl group, the C1-C30 iodo-acetyl group, the C2-C30 iodo-acetylalkyl group, the C1-C30 iodo-carboxyl group, the C2-C30 iodo-alkyl carboxyl group, and the C4-C30 iodo-cycloalkyl carboxyl group; the C3-C30 saturated or unsaturated iodo-hydrocarbon ring or the C3-C30 iodo-heterocyclic group;

$A_1$ is an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group;

$B_1$, $B_2$, and $B_3$ are independently H, I, a C1-C3 alkyl group, or a C1-C3 iodo-alkyl group;

$S_1$, $S_2$, $S_3$, and $S_4$ are independently I or a C6-C15 iodo-aryl group, a C1-C15 iodo-alkyl group, a C3-C15 iodo-cycloalkyl group, a C1-C15 iodo-hydroxylalkyl group, a C2-C15 iodo-alkoxy group, and a C3-C15 iodo-alkoxyl alkyl group;

$F_1$ is a C1-C5 fluorocarbon or a C1-C5 iodo-fluorocarbon; and $0 \text{ mol } \% < i < 100 \text{ mol } \%$, $0 \text{ mol } \% < j < 100 \text{ mol } \%$, $0 \text{ mol } \% < k < 100 \text{ mol } \%$, and $0 < i+j+k \leq 100 \text{ mol } \%$.

9. The method according to claim 8, wherein the sensitizer is an iodine-containing sensitizer.

10. The method according to claim 8, wherein the 3-D structures are one or more of norbornyl, adamantyl, basketanyl, twistanyl, cubanyl, and dodecahedranyl groups.

11. The method according to claim 8, wherein the photoresist composition further comprises a cross-linking agent.

12. The method according to claim 11, wherein the cross-linking agent is selected from

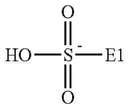 or 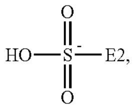

where E1 is selected from polar groups, sterically hindering substituted and unsubstituted cycloalkanes, lactones, and 3-D structures, and E2 is an acid labile group.

13. The method according to claim 8, wherein the polymer includes iodine or an iodo group attached to the polymer.

14. A photoresist composition, comprising:

an iodine-containing sensitizer;

a photoactive compound; and a polymer, wherein the iodine-containing sensitizer includes one or more

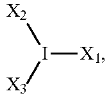

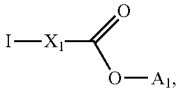

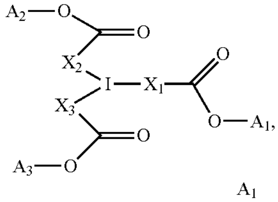

and $I^-$ or 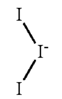

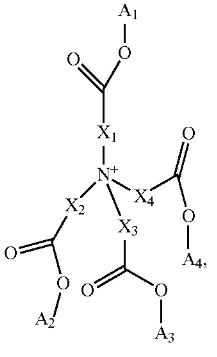

wherein when the iodine-containing sensitizer includes

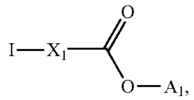

$X_1$ is a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, a C4-C30 iodo-cycloalkyl carboxyl group, a C3-C30 saturated or unsaturated iodo-hydrocarbon ring, or a C3-C30 iodo-heterocyclic group, when the iodine-containing sensitizer includes

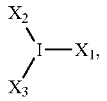

$X_1$, $X_2$, and $X_3$ are independently a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alky carboxyl group, a C4-C30 iodo-cycloalkyl carboxyl group, or a C3-C30 iodo-heterocyclic group, when the iodine-containing sensitizer includes

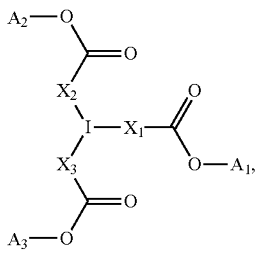

$X_1$, $X_2$, and $X_3$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alkyl carboxyl group, a C4-C30 iodo-cycloalkyl carboxyl group, a C3-C30 saturated or unsaturated iodo-hydrocarbon ring, or a C3-C30 iodo-heterocyclic group, and when the iodine-containing sensitizer includes $I^-$ or 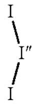

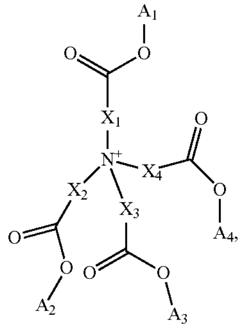

$X_1$, $X_2$, $X_3$, and $X_4$ are independently a direct bond, a C6-C30 iodo-aryl group, a C1-C30 iodo-alkyl group, a C3-C30 iodo-cycloalkyl group, a C1-C30 iodo-hydroxylalkyl group, a C2-C30 iodo-alkoxy group, a C3-C30 iodo-alkoxyl alkyl group, a C1-C30 iodo-acetyl group, a C2-C30 iodo-acetylalkyl group, a C1-C30 iodo-carboxyl group, a C2-C30 iodo-alkyl carboxyl group, a C4-C30 iodo-cycloalkyl carboxyl group, a C3-C30 saturated or unsaturated iodo-hydrocarbon ring, or a C3-C30 iodo-heterocyclic group, $A_1$, $A_2$, $A_3$, and $A_4$ are independently an acid labile group selected from a C6-C15 iodo-aryl group, a C4-C15 iodo-alkyl group, a C4-C15 iodo-cycloalkyl group, a C4-C15 iodo-hydroxylalkyl group, a C4-C15 iodo-alkoxy group, and a C4-C15 iodo-alkoxyl alkyl group.

15. The photoresist composition of claim 14, wherein $X_1$, $X_2$, $X_3$, $X_4$, $A_1$, $A_2$, $A_3$, and $A_4$ are independently a chain group, a cyclic group, or a 3-D group.

16. The photoresist composition of claim 14, wherein the iodides are triiodides.

17. The photoresist composition of claim 14, wherein the iodine-containing sensitizer further comprises one or more of:

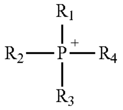 $I^-$ and 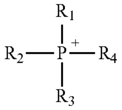 [I-I-I], where $R_1$, $R_2$, $R_3$, and $R_4$ are independently a C2-C15 alkyl group, a C3-C15 cycloalkyl group, a C1-C15 hydroxylalkyl group, a C2-C15 alkoxy group, a C3-C15 alkoxyl alkyl group, a C1-C15 acetyl group, a C2-C15 acetylalkyl group, a C1-C15 carboxyl group, a C2-C15 alkyl carboxyl group, a C4-C15 cycloalkyl carboxyl group, a C3-C15 saturated or unsaturated hydrocarbon ring, or a C2-C15 heterocyclic group.

18. The photoresist composition of claim 17, wherein $R_1$, $R_2$, $R_3$, and $R_4$ are independently a chain, a ring, or 3-D structure.

19. The photoresist composition of claim 14, wherein the photoresist composition further comprises a cross-linking agent.

20. The method according to claim 19, wherein the cross-linking agent is selected from

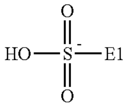 or 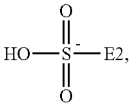, where E1 is selected from polar groups, sterically hindering substituted and unsubstituted cycloalkanes, lactones, and 3-D structures, and E2 is an acid labile group.

* * * * *